(12) United States Patent
O'Brien et al.

(10) Patent No.: US 12,176,388 B2
(45) Date of Patent: Dec. 24, 2024

(54) TRANSITION METAL DICHALCOGENIDE NANOWIRES AND METHODS OF FABRICATION

(71) Applicant: Intel Corporation, Santa Clara, CA (US)

(72) Inventors: Kevin O'Brien, Portland, OR (US); Chelsey Dorow, Portland, OR (US); Kirby Maxey, Hillsboro, OR (US); Carl Naylor, Portland, OR (US); Shriram Shivaraman, Hillsboro, OR (US); Sudarat Lee, Hillsboro, OR (US); Tanay Gosavi, Portland, OR (US); Chia-Ching Lin, Portland, OR (US); Uygar Avci, Portland, OR (US); Ashish Verma Penumatcha, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 1034 days.

(21) Appl. No.: 16/914,137

(22) Filed: Jun. 26, 2020

(65) Prior Publication Data

US 2021/0408227 A1   Dec. 30, 2021

(51) Int. Cl.
*H01L 29/04* (2006.01)
*H01L 21/02* (2006.01)
*H01L 27/092* (2006.01)
*H01L 29/06* (2006.01)
*H01L 29/20* (2006.01)
*H01L 29/267* (2006.01)

(52) U.S. Cl.
CPC ...... *H01L 29/045* (2013.01); *H01L 21/02433* (2013.01); *H01L 27/0924* (2013.01); *H01L 29/0669* (2013.01); *H01L 29/2003* (2013.01); *H01L 29/267* (2013.01)

(58) Field of Classification Search
CPC .......... H01L 21/02433; H01L 27/0924; H01L 29/045; H01L 29/0665; H01L 29/0669; H01L 29/2003; H01L 29/267
See application file for complete search history.

(56) References Cited

U.S. PATENT DOCUMENTS

| | | | |
|---|---|---|---|
| 2016/0141427 A1* | 5/2016 | Chen ................. | H01L 29/78681 257/349 |
| 2017/0003248 A1* | 1/2017 | Yang ....................... | H01L 29/24 |
| 2018/0144849 A1* | 5/2018 | Jonker ............. | H01L 29/78391 |
| 2018/0374962 A1* | 12/2018 | Das ....................... | H01L 29/778 |
| 2019/0067375 A1* | 2/2019 | Karda ............. | H01L 21/823487 |

* cited by examiner

*Primary Examiner* — Brook Kebede
(74) *Attorney, Agent, or Firm* — Essential Patents Group, LLP

(57) ABSTRACT

A transistor structure includes a first channel layer over a second channel layer, where the first and the second channel layers include a monocrystalline transition metal dichalcogenide (TMD). The transistor structure further includes a source material coupled to a first end of the first and second channel layers, a drain material coupled to a second end of the first and second channel layers, a gate electrode between the source material and the drain material, and between the first channel layer and the second channel layer and a gate dielectric between the gate electrode and each of the first channel layer and the second channel layer.

20 Claims, 20 Drawing Sheets

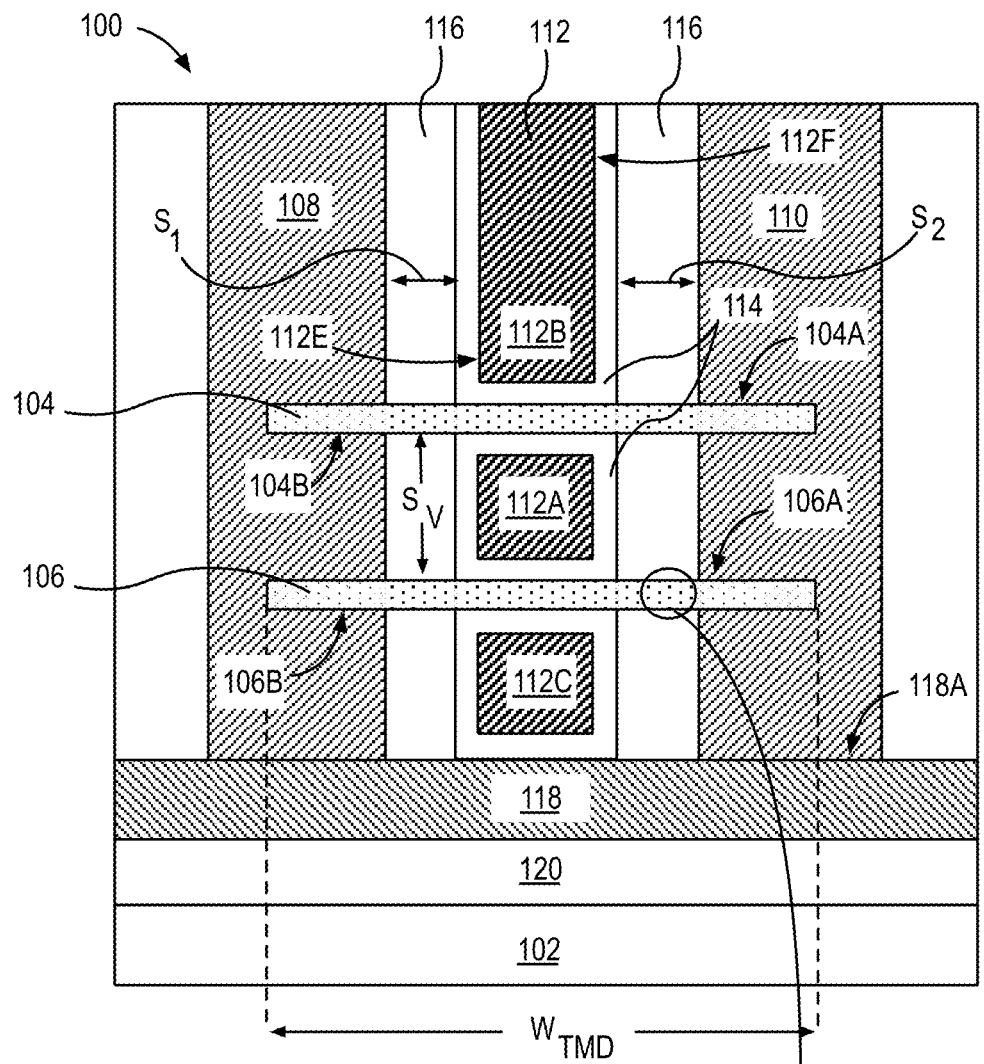
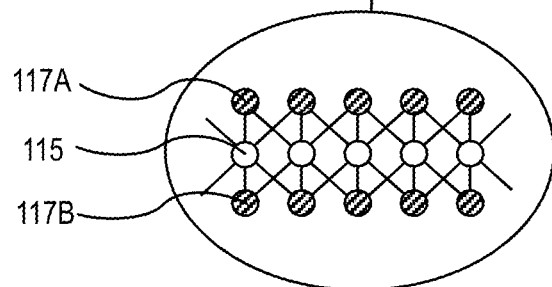
FIG. 1A
FIG. 1B

TRANSITION METAL DICHALCOGENIDE NANOWIRES AND METHODS OF FABRICATION

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of devices on a chip, lending to the fabrication of products with increased functionality. Scaling of such transistors which include silicon channels becomes more challenging when device metrics such as mobility, subthreshold slope or gate capacitance for example, become adversely affected at dimensions less than 5 nm. While transistors have relied on silicon channels, it has become increasingly significant to develop non-silicon based channel material. Some examples of non-silicon based channel materials include transition metal dichalcogenide (TMD). One or more monolayers of TMD materials may be implemented as channel layers in nanowire architecture to improve mobility and subthreshold slope as well as enable transistor scaling.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

FIG. 1A is a cross-sectional illustration of a transistor including a plurality of 2-dimensional nanowires, in accordance with an embodiment of the present disclosure.

FIG. 1B is a schematic of a monolayer of TMD material.

DESCRIPTION OF THE EMBODIMENTS

Figure 2A:
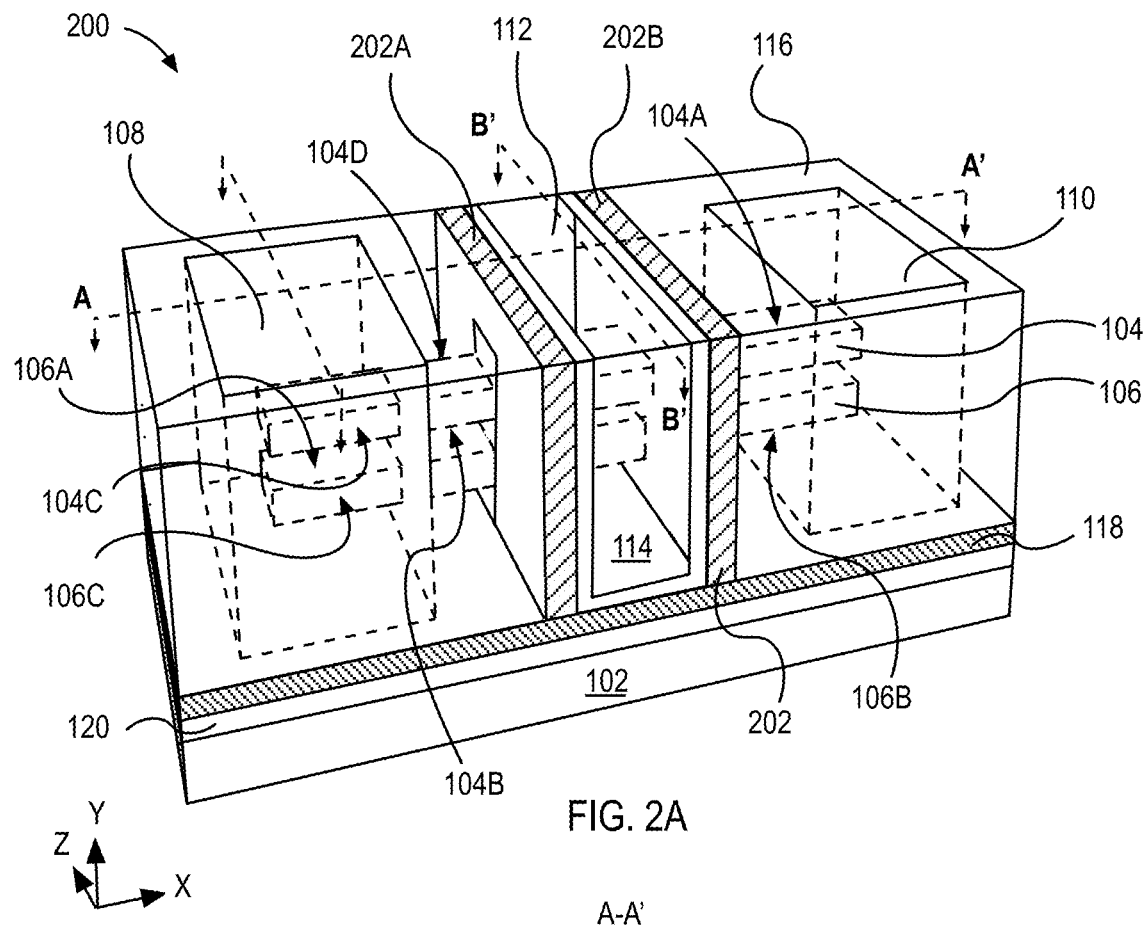
FIG. 2A is an isometric illustration of a transistor where a first TMD channel and second TMD channel above the first TMD channel each include greater than 2 monolayers of TMD.

TMD nanowire for transistor applications and methods of fabrication are described. In the following description, numerous specific details are set forth, such as structural schemes and detailed fabrication methods in order to provide a thorough understanding of embodiments of the present disclosure. It will be apparent to one skilled in the art that embodiments of the present disclosure may be practiced without these specific details. In other instances, well-known features, such as operations associated with group III-N transistor, are described in lesser detail in order to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, electrical or in magnetic contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

As used throughout this description, and in the claims, a list of items joined by the term "at least one of" or "one or more of" can mean any combination of the listed terms.

Unless otherwise specified in the explicit context of their use, the terms "substantially equal," "about equal" and "approximately equal" mean that there is no more than incidental variation between two things so described. In the art, such variation is typically no more than +/−10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

To enable feature size scaling in silicon channels, transistor architecture such as nanowire and stacked nanowires have been adopted. Nanowire transistors provide benefits such as near ideal sub-threshold slopes, low leakage current and less degradation of mobility with gate voltage compared to other transistor architectures. As dimensions of various components of nanowire transistors (channel width and gate length) are decreased to increase device density, device metrics such as carrier mobility and subthreshold slope, parasitic capacitance, may be adversely impacted. Nanowire transistors that include monocrystalline silicon channels, in particular, are prone to mobility and subthreshold slope degradation as channel widths approach 7 nm. Mobility in silicon nanowires diminishes by over 60% as nanowires are scaled below 7 nm to 3.5 nm, for example. Mobility degradation may be attributed to impurity scattering loss in silicon channels.

Scaling gate length while also decreasing silicon channel width leads to other issues. As gate length of a transistor is decreased, threshold voltage of the transistor is decreased. A reduction in threshold voltage increases $I_{off}$ (off-state current). An increase in $I_{off}$ may cause degradation in subthreshold slope characteristic of the transistor. Gate lengths may not be arbitrarily scaled with respect to channel widths. For silicon channels that are approximately 5 nm wide, gate length may be reduced to 10 nm-15 nm. While silicon offers relative ease of fabrication and cost benefits, development of scaling of channel widths to dimensions below 13 nm depends on implementation of channel material other than silicon or incorporation of channel materials in conjunction with silicon.

A channel material that may enable dimensional scaling below 13 nm while preserving mobility may be able to support reduction in gate length of a transistor having a near ideal subthreshold slope. A subthreshold slope that is substantially close to 60 mV/decade is considered to be ideal.

The inventors have found that nanowires fashioned from two dimensional materials, such as transition metal dichalcogenide (TMD), offer several advantages over conventional silicon. A monolayer of a TMD material may be on the order of 0.7 nm, or inherently 2-dimensional (2D). TMD materials have a high Young's modulus and can be utilized to form 2-d nanowires.

Certain TMD materials have direct band gap of 1.67 eV that is comparable to silicon. A single monolayer of a TMD material may be utilized as a channel. And stacking physically isolated monolayers of TMD above each other can be utilized to increase an on-state current of a transistor. Additional advantages include the ability of a 2D TMD material to be able to conduct both electrons and holes enabling direction of the current flow in transistor to be reversed rapidly. Rapid reversal of current flow can be advantageous for memory applications.

In some embodiments, a TMD channel layer may include more than one monolayer of TMD, for example, a stack of 2 to 4 monolayers. Stacking of monolayers of TMD may change electrical properties of the channel layer, such as from having a direct band gap to having an indirect bandgap. However, 2-4 monolayers of TMD material may provide sufficient advantage over silicon channels.

In accordance with an embodiment of the present disclosure a transistor includes a plurality of channel layers arranged in a vertically stacked formation, where each of the plurality of channel layers are separate from each other and where each include a monocrystalline transition metal dichalcogenide (TMD). In one embodiment, the transistor includes a first channel layer over a second channel layer, where the first and the second channel layers comprise a monocrystalline TMD. The TMD channel layers may be a single monolayer or multiple monolayers stacked vertically. A single monolayer may have a thickness of at least 0.7 nm and a stacked TMD channel layer may have a thickness between 2 nm-3.0 nm. The transistor further includes a source material coupled to a first end of the first and second channel layers and a drain material coupled to a second end of the first and second channel layers. A gate electrode is between the source material and the drain material and between the first channel layer and the second channel layer, and a gate dielectric is between the gate electrode and each of the first channel layer and the second channel layer.

In some embodiments, the gate electrode is also on top and bottom surfaces of the first and second channel layers. In embodiments where the first and/or the second channel layer(s) have a thickness greater than 2 monolayers, the gate dielectric may be on sidewall surfaces of the channel layers. The first and the second channel layers may be separated by 8 nm to 10 nm to enable formation of gate dielectric and gate electrode between the first and second channel layers. The source material and the drain material may extend close edges of the gate dielectric to minimize external resistance of the nanowire transistor. The gate electrode may be spaced apart from the source material or drain material by as little as a few nanometers.

FIG. 1A is a cross-sectional illustration of a transistor 100 above a substrate 102. The transistor 100 includes a channel layer 104 over a channel layer 106, where the channel layer 104 and channel layer 106 include a monocrystalline transition metal dichalcogenide (TMD), herein TMD channel 104 or TMD channel 106. The transistor 100 further includes a source contact 108 coupled to a first end of the TMD channel 104 and TMD channel 106 and a drain contact 110 coupled to a second end of the TMD channel 104 and TMD channel 106, as shown. A gate electrode 112 is between the source contact 108 and the drain contact 110. The gate electrode 112 is between the TMD channel 104 and TMD channel 106 and a gate dielectric layer 114 is between the gate electrode 112 and the TMD channel 104 and TMD channel 106.

FIG. 1B is a schematic of a monolayer of TMD material. In the illustrative embodiment, the TMD material includes a layer of a transition metal 115 between a layer of chalcogen atoms 117A and a layer of chalcogen atoms 117B, as shown. Depending on arrangements of the atoms, the structures of TMDs can have various crystal orientations, such as trigonal prismatic (hexagonal), octahedral (tetragonal, T) or their distorted phase (T0). In the illustrative embodiment, the TMD material is hexagonal. The monolayer of TMD, as shown has a thickness of approximately 0.7 nm. The transition metal includes molybdenum, tungsten or chromium, and the chalcogen includes at least one of sulfur, selenium or tellurium. TMD materials described above advantageously provide channel mobility as high as 700 cm$^2$ V$^{-1}$ s$^{-1}$.

Referring again to FIG. 1A, TMD channel 104 and TMD channel 106 may each have a same or dissimilar number of monolayers of TMD material. In the illustrative embodiment, TMD channel 104 and TMD channel 106 each have 1 or 2 monolayers of TMD material. In some such embodiments, the TMD channel 104 and TMD channel 106 each have a thickness between 0.7 nm and 1.4 nm. A TMD material can have atomically thin dimensions and yet provide a robust mechanical structure because of a high Young's modulus, such as above 200 GPa. TMD materials described above have a Youngs modulus that is as high as 270 GPa. A high Young's modulus provides sufficient strength to form suspended TMD channels 104 and 106, during a fabrication process. In an embodiment, TMD channel 104 and TMD channel 106 each have a lateral width, $W_{TMD}$, that is between 50 nm and 100 nm. In embodiments the TMD channel 104 and TMD channel 106 have a horizontal thickness (into the plane of the Figure) that is between 5 nm and 60 nm. The horizontal thickness may be chosen to achieve a desired drive current in the transistor 100.

The TMD channel 104 and TMD channel 106 may have a same TMD material or be different. In an exemplary embodiment, TMD channel 104 and TMD channel 106 each include a same material. In some such embodiments, TMD channel 104 has a hexagonal, tetragonal or a distorted phase and the TMD channel 106 has the hexagonal, tetragonal or a distorted phase.

The TMD channel 104 and TMD channel 106 have a vertical separation, $S_V$, as shown. In embodiments, $S_V$ is dependent on a thickness of a sacrificial material that is used to create the isolated TMD channels 104 and 106. $S_V$ may be between 4 nm and 10 nm. A minimum $S_V$ may also be dependent on a minimum grain size of the material of the gate electrode 112 and on a minimum thickness of the gate dielectric layer 114. $S_V$ may also depend on a horizontal thickness (into the plane of the Figure) of the TMD channels 104 and 106.

As shown, the gate dielectric layer 114 is on an uppermost TMD channel surface 104A and below and directly in contact with a lowermost TMD channel surface 104B. As shown, a gate electrode portion 112A extends between the TMD channel surface 104B and TMD channel surface 106A. The gate dielectric layer 114 is also on the uppermost TMD channel surface 104A and below and directly in contact with lowermost TMD channel surface 106B, as shown. A gate electrode portion 112B is above TMD channel surface 104A and a gate electrode portion 112C is below TMD channel surface 106B. The gate electrode portions 112A, 112B and 112C are in contact with each other on a plane behind, and on a plane in front of the plane of the cross-sectional illustration shown in FIG. 1A.

Depending on embodiments, the gate dielectric layer 114 includes a material that is sufficiently crystalline to form a uniform gate oxide in direct contact with surfaces of TMD channels 104 and 106. In an embodiment, the gate dielectric layer 114 includes hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In embodiments the gate dielectric layer 114 has a thickness between 0.8 nm and 1.5 nm.

In an embodiment, the gate electrode 112 includes one or more layers, where a first layer in contact with the gate dielectric layer 114 is a work function electrode and a second layer in contact with the first is a fill metal. Depending on $S_V$, some gate electrode portions such as gate electrode portion 112A may only include a work function electrode, while gate electrode portions 112B and 112C may include a work function electrode and a fill metal.

In an embodiment, the source contact 108 is laterally spaced apart from the gate dielectric layer 114 on gate electrode sidewall 112E by a distance $S_1$ and source contact 108 is laterally spaced apart from the gate dielectric layer 114 on gate electrode sidewall 112F by a distance $S_2$. In embodiments, $S_1$ and $S_2$ may be substantially the same. In embodiments, $S_1$ and $S_2$ are at least 3 nm but can be as much as 10 nm.

There may be one or more layers of dielectric material between gate dielectric layer 114 and source contact 108 and between the gate dielectric layer 114 and drain contact 110. In the illustrative embodiment, a dielectric 116 is between gate dielectric layer 114 and source contact 108 directly above and below TMD channel 104, and TMD channel 106. As shown, a dielectric 116 is between gate dielectric layer 114 and drain contact 110 directly above and below TMD channel 104, and TMD channel 106. In embodiments, dielectric layer 116 includes silicon and one or more of nitrogen, oxygen and carbon such as, silicon nitride, silicon dioxide, carbon doped silicon nitride, silicon oxynitride or silicon carbide.

In an embodiment, the TMD channel 104 and TMD channel 106 each have a crystal orientation that is substantially matched to one or more underlying material. In the illustrative embodiment, TMD channel 104 and TMD channel 106 are substantially lattice matched to a plurality of templating and buffer layers where each templating and buffer layer includes a group III-Nitride (III-N) material. In an embodiment, transistor 100 includes a template layer 118 in contact with the source contact 108 and drain contact 110, and buffer layer 120 directly below and in contact with the template layer 118.

In an embodiment, the template layer 118 includes a binary or a ternary III-N material, such as gallium nitride (GaN), one or more ternary alloys of GaN, such as AlGaN, or a quaternary alloy of GaN including at least one group III element and nitrogen, such as $In_XAl_YGa_{1-X-Y}N$, where "X" ranges from 0.01-0.1 and "Y" ranges from 0.01-0.1. In some embodiments, the templating layer 118 includes AlInN. The template layer 118 provides a template for hexagonal crystal in TMD channel 104 and TMD channel 106. The template layer 118 is an electrically non-conductive layer. In the illustrative embodiment, gate dielectric layer 114 is in direct contact with an uppermost surface 118A of the template layer 118. In embodiments, the template layer 118 includes GaN. The thickness of the GaN template layer may be between 10 nm and 50 nm.

In an embodiment, the buffer layer 120 includes a single layer of AlN. In embodiments, the thickness of the AlN buffer layer 120 is between 100 nm and 400 nm. In an embodiment, the substrate 102 includes a single crystal silicon, or a silicon on insulator (SIO) substrate.

In other embodiments, TMD channel 104 and TMD channel 106 each include up to 4 monolayers. A thickness of 4 monolayers (3 nm or less) provides sufficient mobility advantage over silicon channel layers having a similar thickness. In embodiments where TMD channel 104 and TMD channel 106 each include up to 4 monolayers, the TMD channel 104 and TMD channel 106 may include sidewalls.

FIG. 2A is an isometric illustration of a transistor 200 where TMD channel 104 and TMD channel 106 each include greater than 2 monolayers of TMD. TMD channel 104 and TMD channel 106 may each include a stack of 3-4 single monolayers of TMD such as a stack of single TMD monolayers illustrated in FIG. 1B. In an embodiment, the 3-4 monolayers of TMD corresponds to a thickness between 2 nm and 3 nm.

Figure 2B:
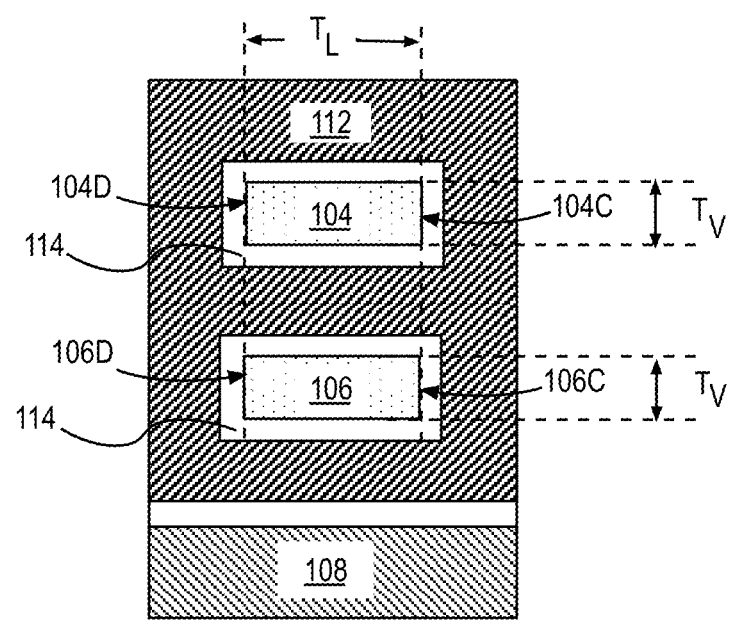
FIG. 2B is a cross-sectional illustration along the line A-A' of the structure in FIG. 2A, illustrating the dielectric around the TMD channels and the gate electrode in contact with the gate dielectric layer.

FIG. 2B is a cross-sectional illustration along the line A-A' of the structure in FIG. 2A. As shown, TMD channel 104 and TMD channel 106 each have a thickness, $T_V$, along a Y-direction, that is orthogonal to a longitudinal length (along X-axis). As shown, TMD channel 104 and TMD channel 106 each have a lateral thickness, $T_L$, along a direction (Z-axis). In an embodiment, $T_V$, is between 1.4 nm and 3 nm, and wherein the $T_L$, is between 5 nm and 60 nm. In embodiments, $T_V$ and $T_L$ may be chosen such that a resultant cross-sectional TMD channel area (product of $T_V$ and $T_L$) can provide desired drive current in the transistor 200.

In the illustrative embodiment, TMD channel 104 and TMD channel 106 are nano-ribbons. In other embodiments TMD channel 104 and TMD channel 106 have a substantially square-shaped profile. As shown in the cross-sectional illustration, TMD channel 104 has a sidewall 104C and a second sidewall 104D opposite to sidewall 104C, and TMD channel 106 has a sidewall 106C and a second sidewall 106D opposite to sidewall 106C.

In the illustrative embodiment, gate dielectric layer 114 surrounds TMD channel 104 and TMD channel 106. As shown, gate dielectric layer 114 is directly adjacent to sidewalls 104C and 104D of TMD channel 104 and directly adjacent to sidewalls 106C and 106D of TMD channel 106. In some embodiments, gate dielectric layer 114 has a uniform thickness on sidewalls 104C and 104D and on 106C and 106D. In the illustrative embodiment, the gate electrode 112 surrounds each of TMD channel 104 and TMD channel 106.

Referring again to FIG. 2A, there may be more than one dielectric material adjacent to gate dielectric layer 114. In the illustrative embodiment, there are two dielectric materials between gate dielectric layer 114 and source contact 108 and between gate dielectric layer 114 and drain contact 110. As shown, a dielectric spacer 202 has a dielectric spacer portion 202A that is directly adjacent to gate dielectric layer 114 and between the source contact 108 and the gate dielectric layer 114. A dielectric spacer 202B is directly adjacent to the gate dielectric layer 114 and is between the gate dielectric layer 114 and the drain contact 110. The dielectric spacer 202 is adjacent to sidewalls 104C and 104D of TMD channel 104, and also adjacent to sidewalls 106C and 106D (on opposite side of 106C—not visible in picture) of TMD channel 106. The dielectric spacer 202 may be present directly above TMD channel 104 and TMD channel 106. In the illustrative embodiment, dielectric spacer 202 has a portion that is directly above TMD channel 104. In some such embodiments, dielectric 116 is between the dielectric spacer 202 and TMD channel 104. As shown, dielectric spacer 202 is not in contact with top surface 104A and 106A and bottom surfaces, 104B, and 106B. In other embodiments, dielectric spacer 202 is not above TMD channel 104 and/or TMD channel 106, but adjacent to TMD channel 104 and TMD channel 106.

As discussed above, source contact 108 and drain contact 110 may extend laterally towards the gate electrode 112. In one embodiment, the source contact 108 can be in direct contact with dielectric spacer portion 202A and the drain contact can be in direct contact with dielectric spacer portion 202B.

In embodiment, the dielectric spacer 202 includes a material that has a low dielectric constant to reduce capacitance in transistor 200. The dielectric spacer 202 may include silicon, nitrogen and at least one of oxygen or carbon.

Figure 3:
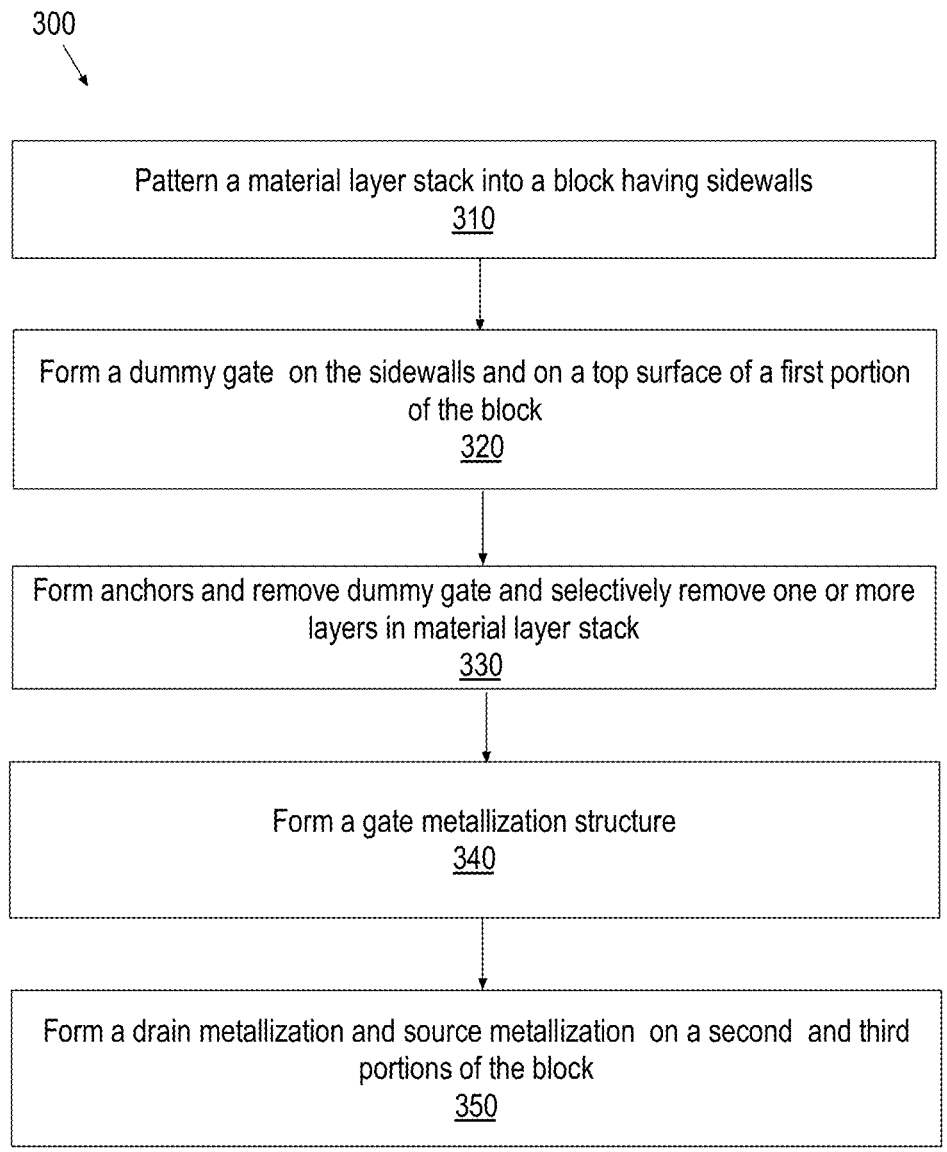
FIG. 3 is a method to fabricate a transistor depicted in FIG. 2A, in accordance with an embodiment of the present disclosure.

FIG. 3 is a method 300 to fabricate a transistor such as transistor 200, described in association with FIG. 2A, in accordance with an embodiment of the present disclosure. The method 300 begins at operation 310 with the formation of a material layer stack including a TMD layer above a group III-N material and patterning of the material layer stack into a block. The method 300 continues at operation 320 with the formation of a dummy gate on a first portion of the block and on sidewalls of the block. The method 300 continues at operation 330 with formation of anchors structures on uncovered portions of the block and followed by removal of the dummy gate from the first portion. The method 300 continues at operation 340 with the formation of a gate structure in the first portion. The method concludes at operation 350 formation of a source structure on a second portion of the block and a drain structure on a third portion of the block opposite to the second portion.

Figure 4A:
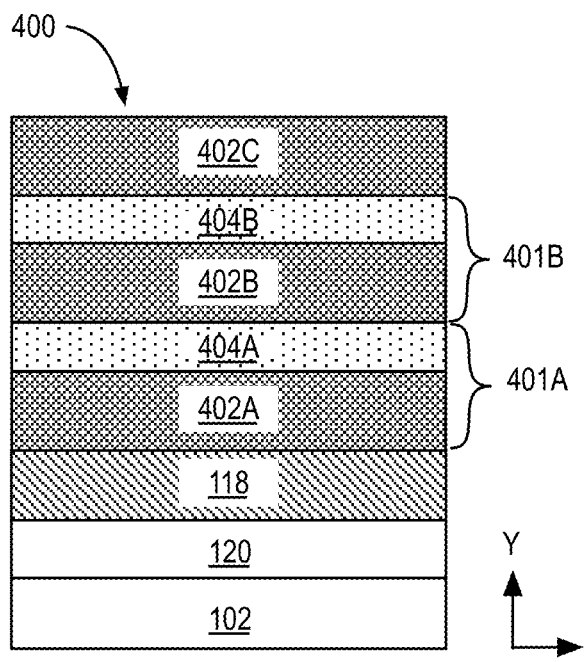
FIG. 4A is a cross-sectional illustration of material layer stack for fabrication of a TMD transistor device, where the material layer stack includes a plurality of bilayers of a TMD layer on a sacrificial layer, in accordance with an embodiment of the present disclosure.

FIG. 4A is a cross-sectional illustration of material layer stack 400 for fabrication of a TMD transistor device, in accordance with an embodiment of the present disclosure. As shown, a buffer layer 120 is formed on the substrate 102.

In an embodiment, the buffer layer 120 is formed to overcome lattice and thermal mismatch between the substrate 102 and group III-N semiconductor material to be formed above. The buffer layer 120 may be grown on the substrate 102 by a metal organic chemical vapor deposition (MOCVD) process at a temperature in the range of 1000-

1100 degrees Celsius. Depending on embodiments, the buffer layer 120 includes nitrogen and one or more of, Al, In or Ga, for example $Al_zGa_{1-z}N$, $Al_wIn_{1-w}N$, or AlN. In exemplary embodiments buffer layer 120 includes AlN. In an embodiment, an AlN buffer layer 120 has a hexagonal wurtzite structure. The buffer layer 120 including AlN may be grown to a thickness between 25 nm and 100 nm. In other embodiments, the buffer layer 120 includes a plurality of layers of III-N materials above the substrate 102. The layers may be interleaved with two or more layers of III-N materials such as but not limited to $Al_zGa_{1-z}N$, $Al_wIn_{1-w}N$, or AlN.

The template layer 118 is formed on the buffer layer 120. In an embodiment, the template layer 118 is formed by an MOVCD epitaxy process. The template layer 118 is deposited to a thickness between 10 nm and 50 nm. In an embodiment, the template layer 118 is a layer of GaN. In an embodiment, the GaN-template layer 118 is grown to a thickness that is between 100 nm and 400 nm. A GaN-template layer 118 may have a defect density less than (1e10/cm2) when grown to a thickness of at least 100 nm.

The process continues with formation of a material layer stack 400 having a plurality of bilayers on the template layer 118. In the illustrative embodiment, the material layer stack includes formation of a bilayer 401A followed by formation of bilayer 401B on bilayer 401A. Bilayer 401A includes a layer 402A and a layer 404A which includes a TMD material, (herein TMD layer 404A) on the layer 402A. Bilayer 401B includes a layer 402B and a layer 404B which includes a TMD material, herein TMD layer 404B on the layer 402B. In the illustrative embodiment, the bilayer 401B is capped by the layer 402C.

In an embodiment, the layers 402A, 402B and 402C include a group III-N material. In an exemplary embodiment, layer layers 402A, 402B and 402C include nitrogen and one or more of Al or In. In an exemplary embodiment, layers 402A, 402B and 402C include AlN. An AlN layer 402A can be grown by MOCVD epitaxially on the template layer 118 and provides a surface for graphoepitaxy growth of the TMD layer 404A. In embodiments, the layers TMD layer 404A or 404B have substantially a same crystal structure as an AlN layer 402A or 402B, respectively. In embodiments where the AlN layer 402A or 402B is single crystalline, templating a TMD layer 404A or 404B off the AlN layer 402A or 402B, respectively facilitates optimizing grain size of the TMD layer 404A or 404B. The layers 402A, 402B and 402C also provide sufficiently high etch selectivity (greater than 5:1) relative to the template layer 118. The AlN layer 402A is grown to a thickness between 6 nm and 8 nm.

The TMD layer 404A is formed on layer 402A, where TMD layer 404A includes a material of the TMD channel 104 or TMD channel 106. Depending on embodiments, TMD layer 404A has a thickness that is between 1-4 monolayers. In the illustrative embodiment, the TMD layer 404A includes at least 3 monolayers. The TMD layer 404A is formed by an MOCVD or a CVD process. In an embodiment, the process to form the bilayer 401A is repeated until a desired number of TMD channel layers is formed. In the illustrative embodiment, a bilayer 401B is formed on the TMD layer 404A of bilayer 401A. The layer 402B in the bilayer 401B is epitaxially formed on TMD layer 404A. The thickness of the layer 402B may or may not be equal to the thickness of the layer 402A. The TMD layer 404B may or may not include a same material as the material of TMD layer 404A or have the same number of monolayers as TMD layer 404A. In an exemplary embodiment, the TMD layer 404A and 404B are substantially the same, i.e., they both include a same material and have a same number of monolayers, as is shown in FIG. 4A. The material layer stack 400 further includes a layer 402C formed on the bilayer 401. While two bilayers 401A and 401B are shown, the number of bilayers can be between 2-10.

Figure 4B:
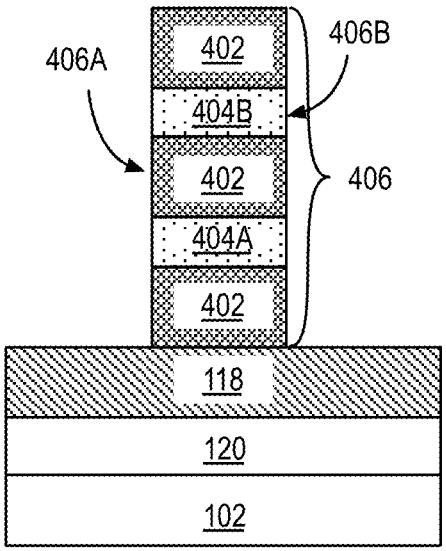
FIG. 4B is a cross sectional illustration of a block formed by patterning the material layer stack

FIG. 4B is a cross sectional illustration of a block 406 formed by patterning the material layer stack 400 depicted in FIG. 4A. In an embodiment, a plasma etch process may be utilized to form the block 406. In exemplary embodiments, the sidewalls 406A and 406B may be substantially vertical as shown. The patterning process carried out etches the lowermost layer 402 directly adjacent template layer 118. The etch process is halted after exposure of the template layer 118.

Figure 4C:
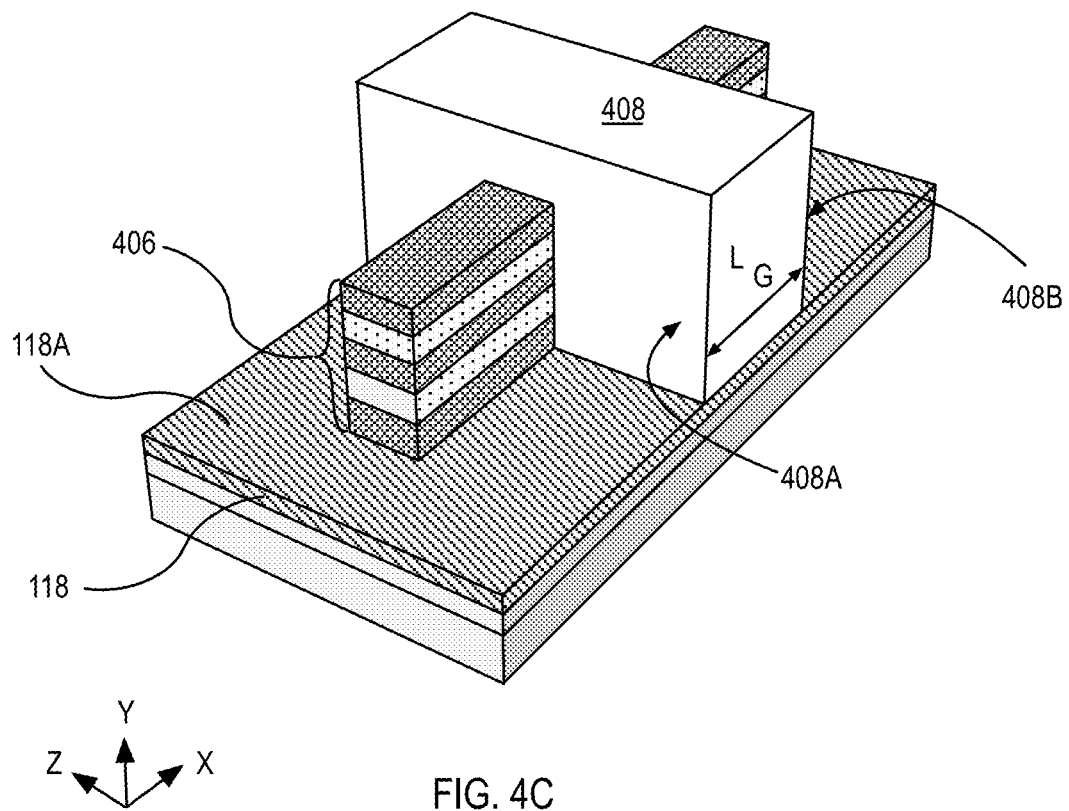
FIG. 4C is an isometric illustration following the formation of a dummy gate structure formed on a first portion of the block.

FIG. 4C is an isometric illustration following the formation of a dummy gate structure 408 formed on a portion of the block 406. In an embodiment, a dummy gate material is blanket deposited on the block 406 and on the template layer 118. In an embodiment, a mask is formed on the dummy gate material and a plasma etch process is utilized to pattern the dummy gate material into dummy gate structure 408, selective to an uppermost surface 118A of the template layer 118, as shown. In an embodiment, the dummy gate structure 408 has sidewalls 408A and 408B that are substantially vertical relative to an uppermost surface of template layer 118. The dummy gate structure 408 has a lateral width, $L_G$. $L_G$ defines a width of a transistor gate that is to be formed.

Figure 4D:
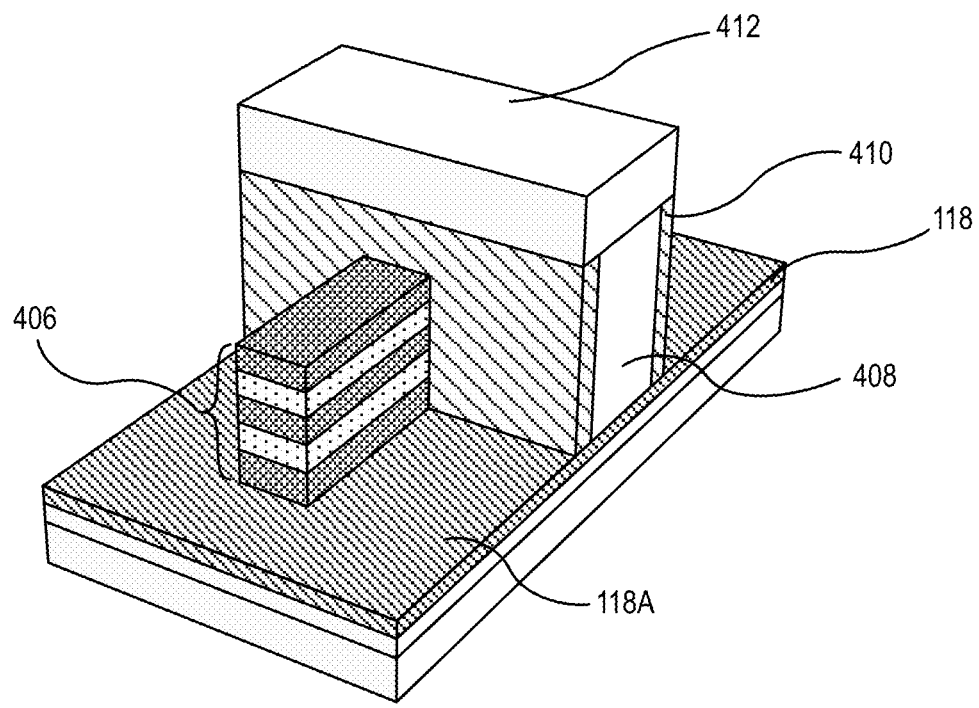
FIG. 4D is an isometric illustration of the structure in FIG. 4C following the formation of a dielectric spacer adjacent to the dummy gate structure.

FIG. 4D is an isometric illustration of the structure in FIG. 4C following the formation of a dielectric spacer 410 adjacent to the dummy gate structure 408. In an embodiment, a dielectric spacer layer is blanket deposited on the block 406 and on the dummy gate structure 408. The deposition process utilized may include a PECVD (plasma enhanced chemical vapor deposition), physical vapor deposition (PVD), chemical vapor deposition (CVD) process. In an embodiment, the dielectric spacer layer includes silicon and nitrogen and/or carbon.

In an embodiment, the dielectric spacer layer is planarized. The planarization process may expose an uppermost surface of the dummy gate structure 408. As shown, a mask 412 is formed over the dummy gate structure 408 and over a portion of the dielectric spacer layer. The dielectric spacer layer is etched to form dielectric spacer 410. A plasma etch may be utilized to pattern the dielectric spacer 410. An over etch of the dielectric spacer layer is carried out to remove the dielectric spacer layer from sidewall portions of the block 406 that are not covered by the mask. In the illustrative embodiment, the etch is selective to the material of the uppermost surface 118A.

In the illustrative embodiment, the dielectric spacer 410 is formed on sidewall portions of the block 406 directly adjacent to the dummy gate structure 408. As shown, the dummy gate structure 408 and the dielectric spacer 410 both cover portions of the sidewalls of the block 406.

The dielectric spacer 410 may be formed to a thickness that is determined by downstream process, electrical performance (such as modulating external resistance) or a combination thereof. In an embodiment, the spacer has a lateral width between 5 nm to 10 nm.

Figure 4E:
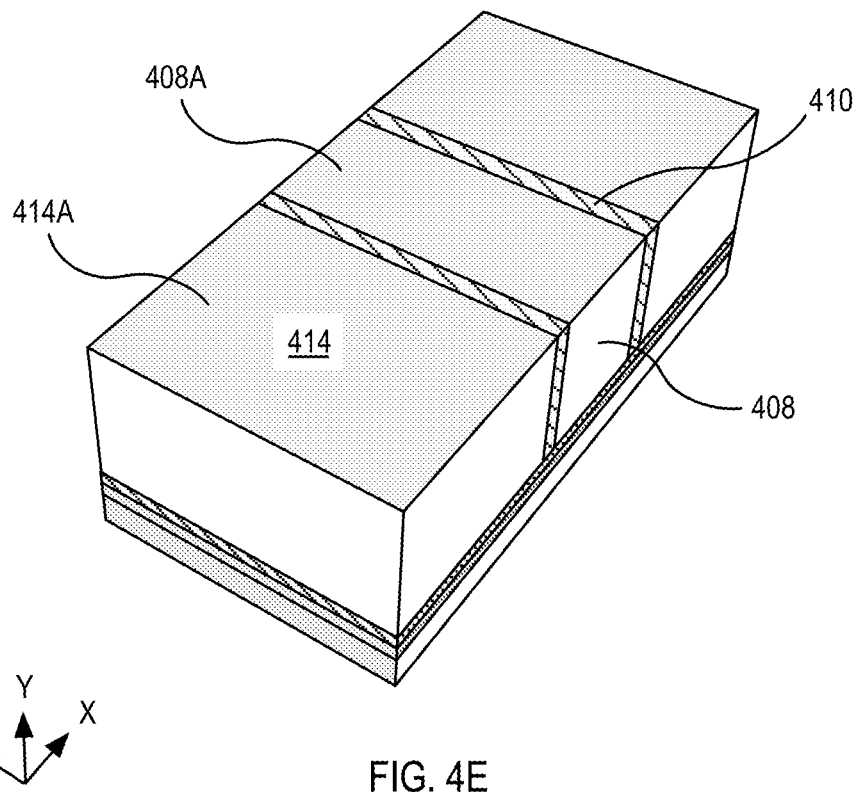
FIG. 4E illustrates the structure of FIG. 4D following the formation of a dielectric on the exposed portions of the block, on the dielectric spacer, and on uppermost surface of the dummy gate structure.

FIG. 4E illustrates the structure of FIG. 4D following the formation of a dielectric 414 on the exposed portions of the block 406 (not visible), on the dielectric spacer 410, and on uppermost surface 408A of the dummy gate structure 408. In an embodiment, the dielectric 414 is deposited by a blanket deposited using a physical vapor deposition (PVD) or a chemical vapor deposition (CVD) process. In an embodiment, a chemical mechanical polish (CMP) process is utilized to planarize the dielectric 414 which forms an uppermost surface 414A that is substantially co-planar, with an uppermost surface 408A of the dummy gate structure 408.

Figure 5A:
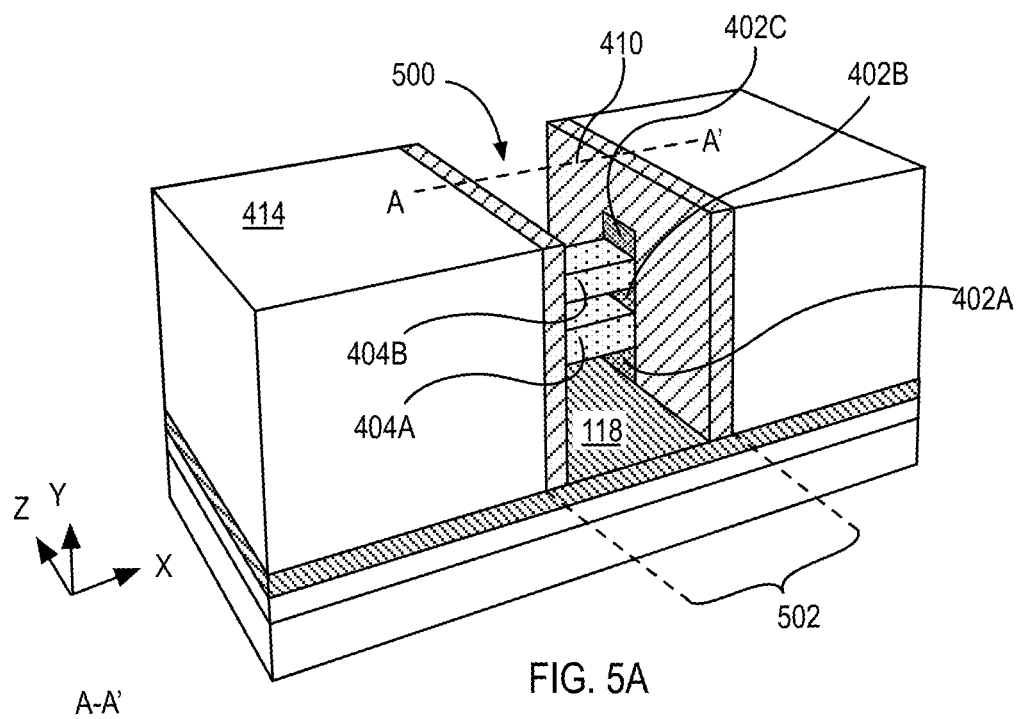
FIG. 5A illustrates the structure of FIG. 4E following the process to remove the dummy gate structure and portions of the sacrificial layer that are exposed after removing the dummy gate structure, where the process creates a plurality of TMD nanowires in an opening.

FIG. 5A illustrates the structure of FIG. 4E following the process to remove the dummy gate structure 408 (not shown) and remove exposed portions of the layers 402A, 402B and 402C and isolate TMD layers 404A and 404B.

In an embodiment, where the dummy gate structure 408 includes a material such as polysilicon, silicon germanium, germanium, a combination of plasma etch and wet chemical etch can be utilized to remove the dummy gate structure 408. Removal of the dummy gate structure 408 forms an opening 500 as illustrated. In an embodiment, removal of the dummy gate structure 408 does not appreciably alter the lateral width of the spacer 410.

After formation of opening 500, portions of the layer 402A, 402B and 402C are selectively removed. The extent of lateral etching (along the X-Z plane) of layers 402A, 402B and 402C may depend on the method utilized to etch. In an embodiment, a wet chemical process is utilized. The wet etch chemistry may selectively etch layers 402A, 402B and 402C with respect to TMD layers 402A and 402B, dielectric spacer 410, template layer 118 and dielectric 414. The process of removing exposed portions of the sacrificial layers 402A, 402B and 402C forms suspended TMD layers 404A and 404B as shown.

Figure 5B:
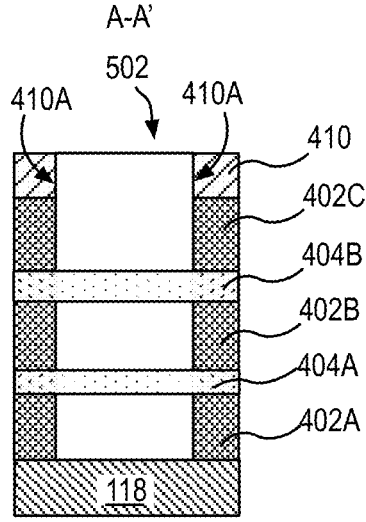
FIG. 5B is a cross-sectional illustration of a portion of the structure in FIG. 5A illustrating the extent of lateral removal of the sacrificial layer, in accordance with an embodiment of the present disclosure.

In an embodiment, the wet etch process etches the layers 402A, 402B and 402C in the opening 500 but not under the spacer as shown in FIG. 5A and in the cross-sectional illustration of a portion 502 in FIG. 5B, through a line A-A'. As shown in FIG. 5B, the layers 402A, 402B and 402C are substantially aligned with sidewalls 410A of dielectric spacer 410.

Figure 5C:
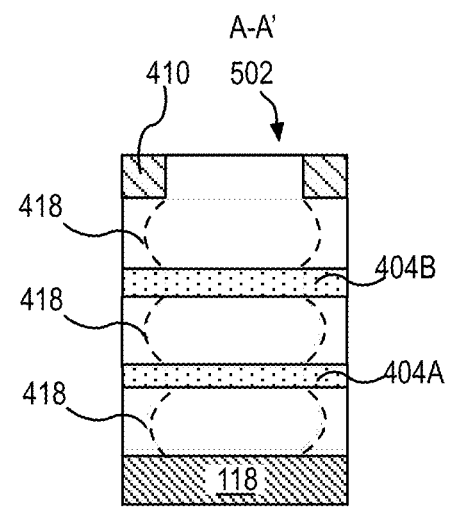
FIG. 5C is a cross-sectional illustration of a portion of the structure in FIG. 5A illustrating the extent of lateral removal of the sacrificial layer, in accordance with an embodiment of the present disclosure.

In an embodiment, the layers 402A, 402B and 402C (not shown in Figure) are completely removed under the spacer 410 as illustrated in FIG. 5C. In some embodiments, the layers 402A, 402B and 402C may be partially recessed under spacer 410, as indicated by dashed lines 418. In an embodiment, the recessed layers 402A, 402B and 402C (not shown in Figure) have curved sidewall profiles as indicated by the dashed line 418.

Figure 5D:
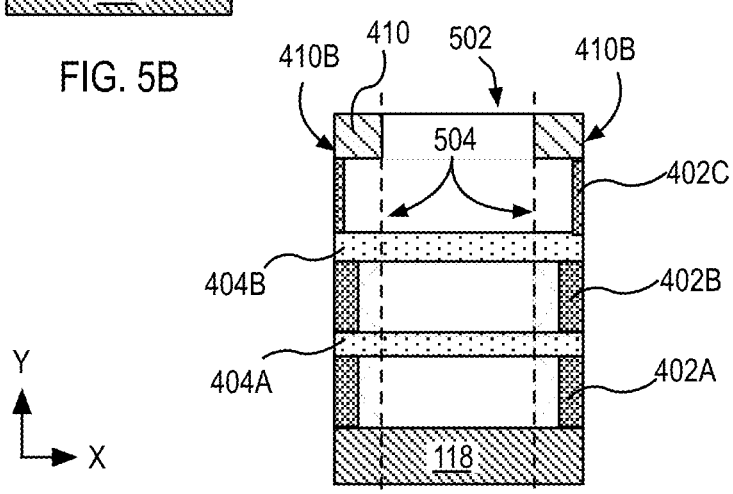
FIG. 5D is a cross-sectional illustration of a portion of the structure in FIG. 5A illustrating the extent of lateral removal of the sacrificial layer, in accordance with an embodiment of the present disclosure.

FIG. 5D is a cross-sectional illustration of a portion 502 in FIG. 5A, where a vapor etch process is utilized to etch layers 402A, 402B and 402C. In the illustrative embodiment, layers 402A, 402B and 402C each have a lateral recess relative to the dashed lines 504, that vary from each other. In the illustrative embodiment, layer 402A and 402B are less laterally recessed than layer 402C. Distance between the dashed lines 504 represents a length of the gate electrode to be formed.

It is to be appreciated that process operations may be implemented to minimize the lateral recess in layers 402A, 402B and 402C. While not shown, in some embodiments, the recess extends beyond sidewall 410B of the dielectric spacer 410.

The extent of lateral recess will disproportionally affect a lateral width of the gate electrode to be formed on top and bottom surfaces of each TMD layers 404A and 404B, from a lateral width of the gate electrode to be formed on sidewall surfaces of the TMD layers 404A and 404B. In examples, where the TMD layers 404B and 404A are monolayer thick, a lateral recess does not affect a lateral width of the gate electrode to be formed due to absence of sidewalls of TMD layers 404B and 404A.

Figures 6A, 6B, 6C:
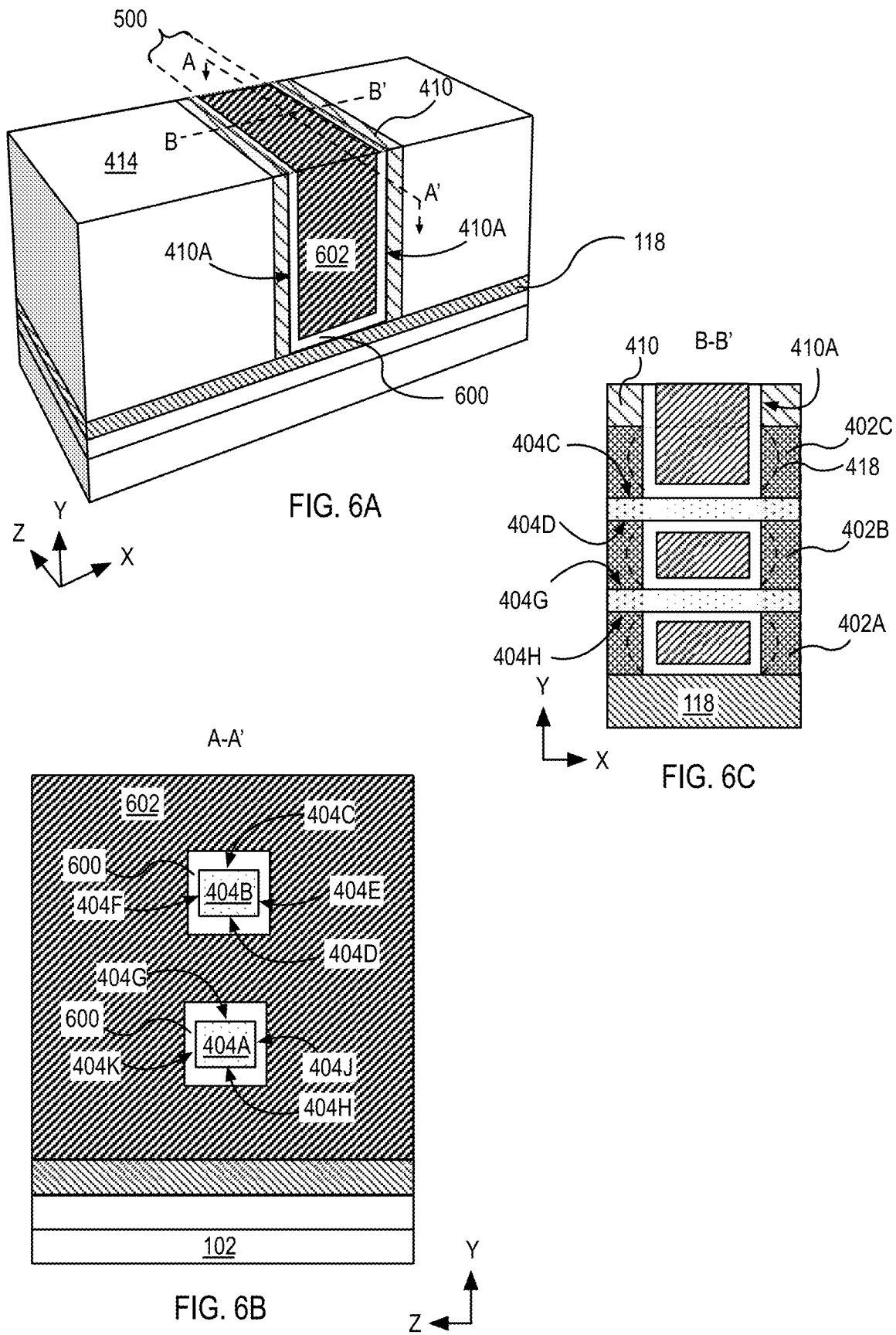
FIG. 6A illustrates the structure of FIG. 5A following the formation of a gate dielectric layer in the opening and formation of a gate electrode on the gate dielectric layer.
FIG. 6B is a cross-sectional illustration of a block sliced through a line A-A' and extending between the line A-A' and a first sidewall of the dielectric spacer.
FIG. 6C is a cross-sectional illustration of the structure in FIG. 6A along the line B-B'. In the illustrative embodiment, the sacrificial layer is not recessed under the first sidewall of the dielectric spacer.

FIG. 6A illustrates the structure of FIG. 5A following the formation of a gate dielectric layer 600 in the opening 500 and formation of a gate electrode 602 on the gate dielectric layer 600.

In an embodiment, gate dielectric layer 600 is blanket deposited in the opening 500, on the dielectric spacer 410 and on the dielectric 414. As shown, dielectric spacer 410 is formed on all exposed surfaces of TMD layers in the opening 500, on the template layer 118 and on sidewalls 410A of spacer 410. In an embodiment, the gate dielectric layer 600 is deposited using an atomic layer deposition (ALD) process. The gate dielectric layer 600 may be deposited to a thickness of 0.8 nm to 2 nm. After formation of the gate dielectric layer 600, one or more layers of gate electrode material is blanket deposited in the opening 500, on the gate dielectric layer 600. After deposition, the one or more layers of gate electrode material and gate dielectric layer 600 may be planarized. In an embodiment, the planarization process is utilized to remove any excess gate electrode material and gate dielectric layer 600 from uppermost surfaces of the dielectric 414, and dielectric spacer 410. The planarization process forms a gate electrode 602.

FIG. 6B is a cross-sectional illustration of a block sliced through a line A-A' and extending between the line A-A' and sidewall 410A in FIG. 6A. In the illustrative embodiment, the gate dielectric layer 600 is on top surface 404C, bottom surface 404D, and sidewall surfaces 404E and 404F of the TMD layer 404B and on top surface 404G, bottom surface 404H, and sidewall surfaces 404J and 404K of TMD layer 404A. In an embodiment, the ALD deposition process provides a sufficiently uniform thickness of gate dielectric layer 600 on all surfaces of the TMD layer 404A and TMD layer 404B.

As shown in the cross-sectional illustration, the gate electrode 602 is adjacent to all exposed surfaces of the gate dielectric layer 600.

FIG. 6C is a cross-sectional illustration of the structure in FIG. 6A along the line B-B'. In the illustrative embodiment, the layers 402A, 402B and 402C are not recessed under dielectric spacer sidewall 410A. In some such embodiment, the gate dielectric layer is uniformly formed on the surfaces 404C, 404D, 404G and 404H and does not extend under dielectric spacer 410. As shown, dielectric spacer 410 is formed adjacent to gate dielectric layer 600. In the illustrative embodiment, the gate electrode 602 does not extend under the dielectric spacer 410.

In embodiments where there is a curved lateral recess in the layer 402A, 402B and/or 402C, the gate dielectric layer 600 will follow a contour of the line 418.

Figure 7A:
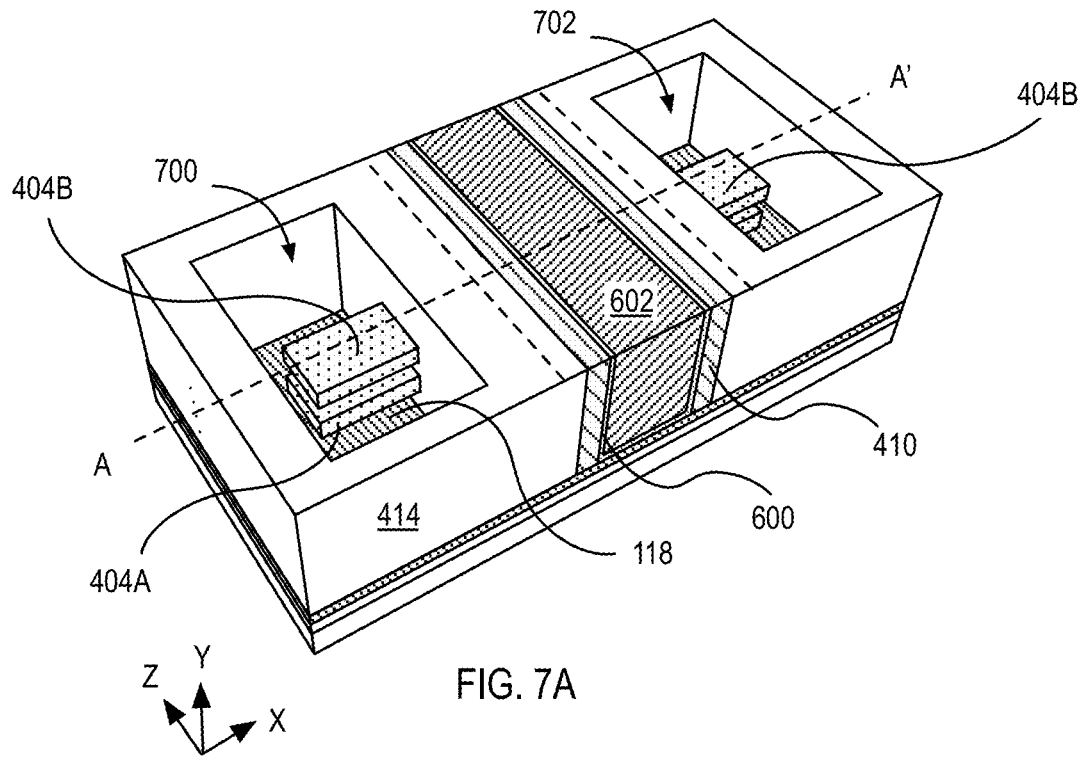
FIG. 7A illustrates the structure of FIG. 6A following the formation of a first opening and a second opening in the dielectric to expose two opposing ends of the TMD nanowires.

FIG. 7A illustrates the structure of FIG. 6A following the formation of openings in the dielectric 414 to form source and drain contacts. In the illustrative embodiment, an opening 700 is formed to expose one end of the TMD layer 404B and an opening 702 is formed to expose a second end of the TMD layer 404B. I am embodiment, a plasma etch process is utilized to form openings 700 and 702 after the formation of a mask on the dielectric 414, on the dielectric spacer 410, on the gate dielectric layer 600 and on the gate electrode 602. In an embodiment, the openings 700 and 702 can extend to dielectric spacer sidewalls 410B. In an embodiment, the dielectric 414 is etched by a plasma etch process to form openings 700 and 702. In an embodiment, the plasma etch is isotropic and removes the dielectric 414 between the TMD layer 404B and 404A, as shown.

In an embodiment, prior to formation of the openings 700 and 702, the layers 402A and 402B (not shown in the Figure) are etched and removed by a wet chemical or a vapor etch process. In other embodiments the layers 402A and 402B are removed after formation of openings 700 and 702.

Figure 7B:
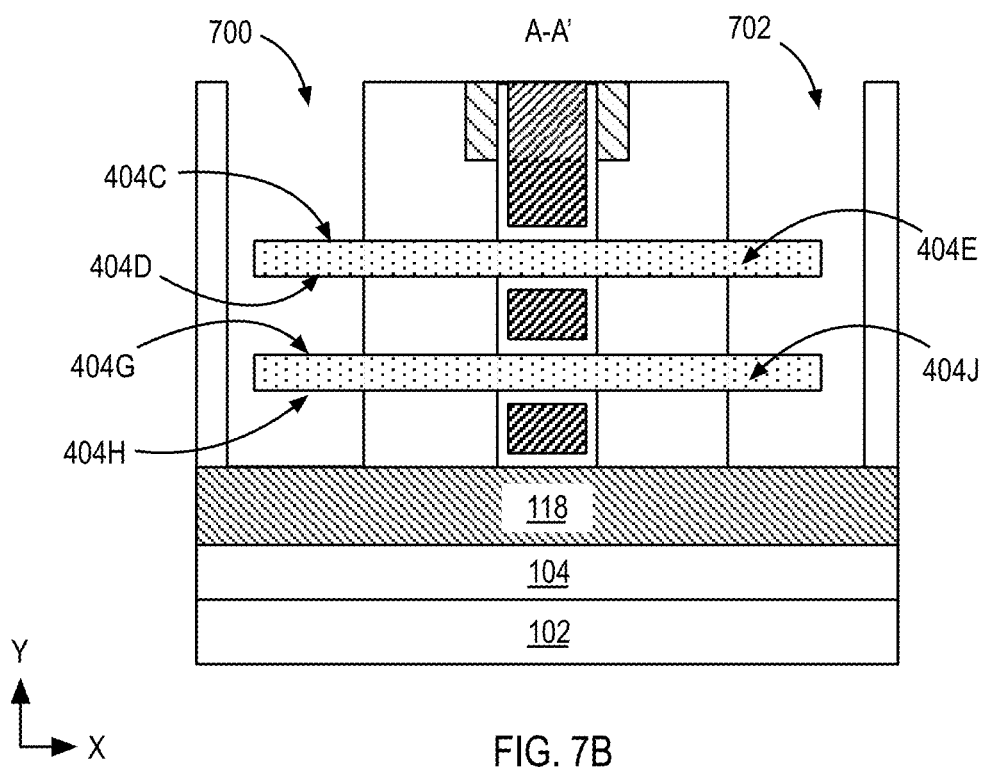
FIG. 7B is a cross-sectional illustration of the structure in FIG. 7A through a line A-A'.

FIG. 7B is a cross-sectional illustration of the structure in FIG. 7A through the line A-A'. In the illustrative embodiment, the layers 402A (between TMD layer 404B and 404A) and 402B (between TMD layer 404A and template layer 118—not shown in the Figure) are etched and removed by a wet chemical or a vapor etch process prior to formation of the opening 700 and 702. Portions of surfaces 404C, 404D, 404E, 404G, 404H and 404J are exposed after formation of opening 700 and 702 as shown in the cross-sectional illustration.

Figure 8:
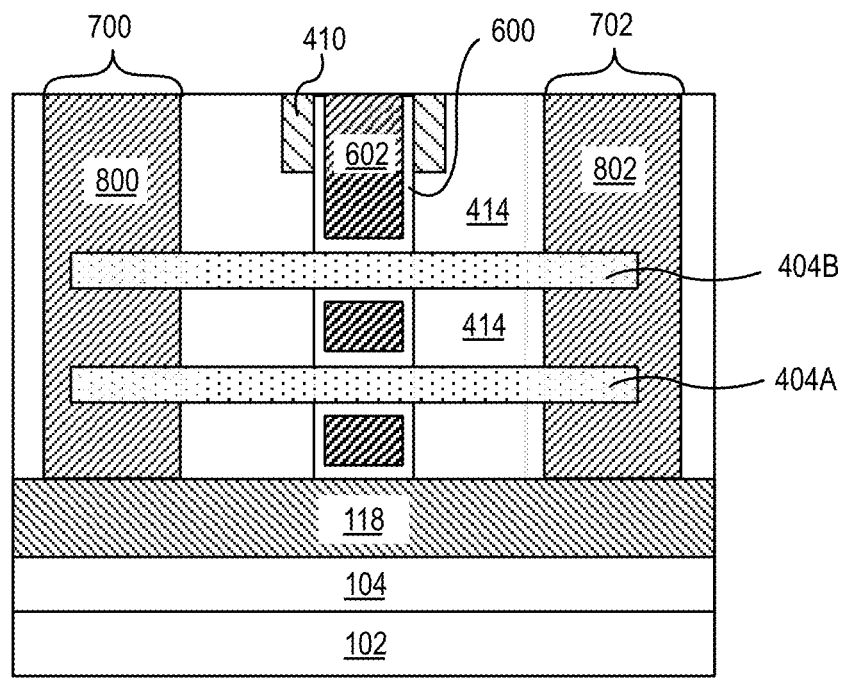
FIG. 8 illustrates the structure of FIG. 7B following the formation of source contact in the first opening in the dielectric and a drain contact in the second opening in the dielectric.

FIG. 8 illustrates the structure of FIG. 7B following the formation of source contact 800 and drain contact 802 in the openings 700 and 702, respectively. In an embodiment, one or more layers of contact material are blanket deposited on exposed surfaces of the TMD layer 404A and 404B and on uppermost surface of the dielectric 414, dielectric spacer 410, gate dielectric layer 600, gate electrode 602, and template layer 118. In an embodiment, the contact material includes one or more materials that are substantially the same as the material of the source contact 108 and drain contact 110 described above. In an embodiment, a first of the one or more contact material is epitaxial to the monocrystalline TMD layers 404A and 404B.

In an embodiment, a planarization process is utilized to remove the excess one or more layers of contact material formed on uppermost surface of the dielectric 414, dielectric spacer 410, gate dielectric layer 600 and gate electrode 602. The planarization process forms source contact 800 and drain contact 802.

In other embodiments, a backbone layer can advantageously provide a stressor support to one or more TMD monolayers. In such embodiments, the one or more TMD monolayers can be epitaxial on a single surface of a backbone layer. For a nanowire having a finite thickness, TMD can be epitaxial on all surfaces of the nanowire. The nanowire can include silicon or non-silicon material. In exemplary embodiments, the channel layer includes a group III-N material that can advantageously lattice match to epitaxial TMD materials. A TMD material on multiple sidewalls of a backbone layer may advantageously increase the drive current of the transistor.

Figure 9A:
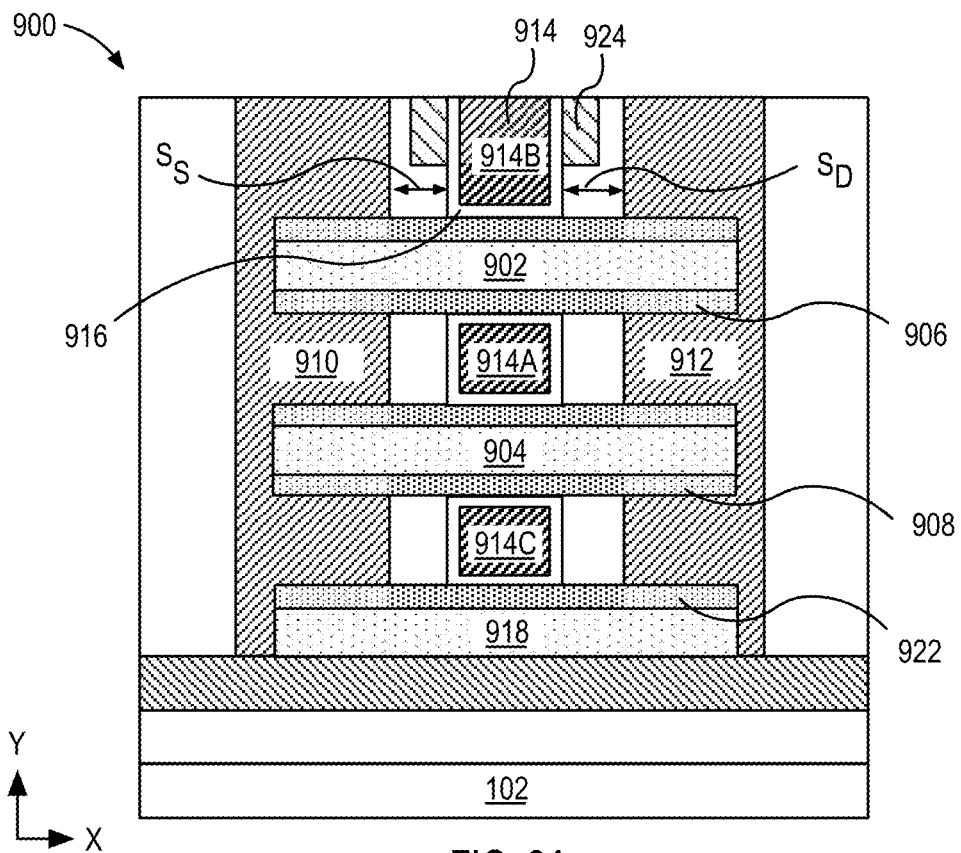
FIG. 9A is a cross sectional illustration of a transistor, where the transistor includes a first nanowire above a second nanowire, and where a TMD layer is adjacent to at least one surface of each of the first nanowire and the second nanowire.

FIG. 9A is a cross sectional illustration of a transistor 900, where the transistor 900 includes a backbone nanowire 902 above a backbone nanowire 904 (herein nanowire 902 and nanowire 904), where the nanowire 902 and the nanowire 904 include a crystal of a Group III-N material. The transistor further includes a channel layer 906 including a monocrystalline transition metal dichalcogenide (TMD), (herein TMD channel layer 906), directly adjacent the nanowire 902, and a channel layer 908 comprising the monocrystalline TMD, herein TMD channel layer 908, directly adjacent the nanowire 904. A source contact 910 is coupled to a first end of the TMD channel layer 906 and TMD channel layer 908. A drain contact 912 is coupled to a second end of TMD channel layer 906 and TMD channel layer 908. A gate electrode 914 is between the source contact 910 and the drain contact 912. The gate electrode 914 has a gate electrode portion 914A between the first nanowire 902 and the second nanowire 904. A gate dielectric 916 between the gate electrode portion 914A and each of the TMD channel layer 906 and TMD channel layer 908.

In an embodiment, the TMD channel layer 906 and TMD channel layer 908 each include one or more properties of the TMD channel 106, such as the material and number of monolayers. In an embodiment, the TMD channel layer 906 and TMD channel layer 908 each have a thickness between 1 and 4 monolayers.

Figure 9B:
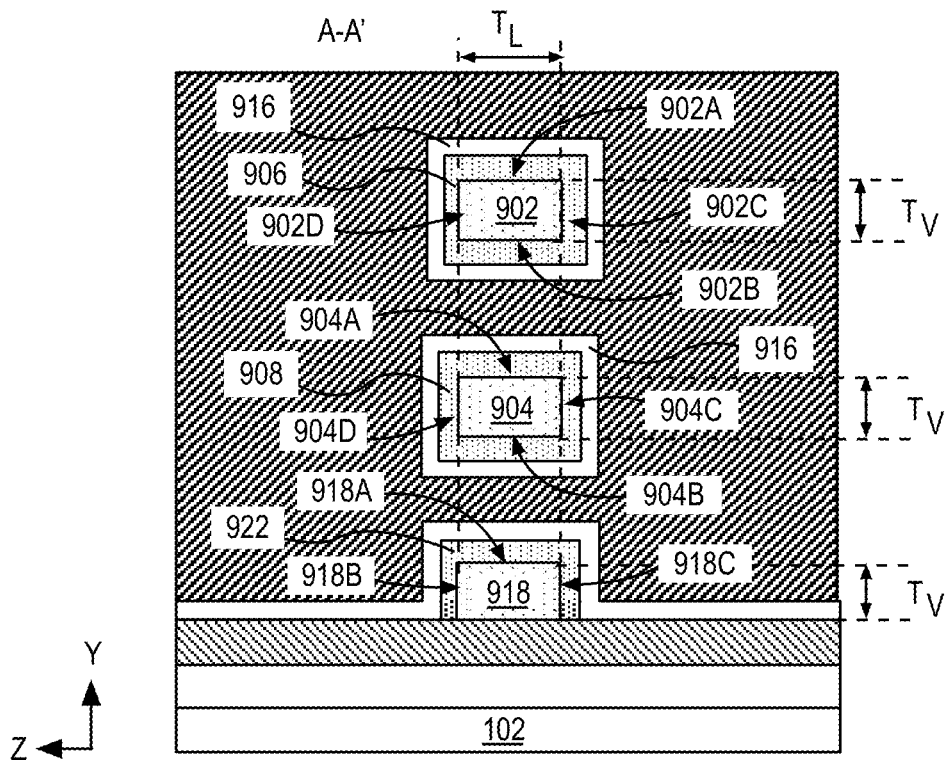
FIG. 9B is a cross sectional illustration through a line A-A' of the structure in FIG. 9A.

FIG. 9B is a cross sectional illustration of the structure in FIG. 9A, through the vertical axis of the structure in FIG. 9A. As shown, the nanowire 902 has a rectangular cross-sectional profile, with a top surface 902A, a bottom surface 902B and sidewall surfaces 902C and 902D. In an embodiment, the nanowire 902 has a first crystallographic orientation on top surface 902A and on bottom surface 902B. The sidewall surfaces 902C and 902D may have a second crystallographic orientation. In an embodiment, the first crystallographic orientation is different from the second crystallographic orientation. In an embodiment, the nanowire 902 includes AlN or InAlN. The nanowire 902 has a vertical thickness, $T_V$, as measured from surface 902B (along Y-direction), between 4 nm and 8 nm. In embodiments, the nanowire 902 has a lateral thickness, $T_L$, as measure from sidewall surface 902C, (along Z-direction) between 5 nm and 60 nm.

In an embodiment, the TMD channel layer 906 is at least on the top surface 902A and on bottom surface 902B. In an embodiment, the TMD channel layer 906 is lattice matched to the first crystallographic orientation of the Group III-N material of nanowire 902. In an embodiment, the TMD channel layer 906 has a monocrystalline structure. In an embodiment, the TMD channel layer 906 has a vertical thickness (as measured away from surfaces 902A or 902B) between 1 and 4 monolayers, corresponding to a thickness between 0.7 nm and 2.8 nm.

As illustrated, TMD channel layer 906 is also on sidewall surfaces 902C and 902D. In an embodiment, the TMD channel layer 906 is lattice matched to the second crystallographic orientation of the sidewall surfaces 902C and 902D. In an embodiment, the TMD channel layer 906 on sidewalls surfaces 902C and 902D has a lateral thickness (as measured away from sidewall surface 902C and 902D, respectively) between 1 and 4 monolayers.

In embodiments, nanowire 904 has one or more properties of the nanowire 902 described above, such as the material composition, crystallographic orientation, and lateral and vertical thicknesses, $T_V$ and $T_L$. As shown, the nanowire 904 has a rectangular cross-sectional profile, with a top surface 904A, a bottom surface 904B and sidewall surfaces 904C and 904D.

In an embodiment, the TMD channel layer 908 is at least on the top surface 904A and on bottom surface 904B. In an embodiment, the TMD channel layer 908 is lattice matched to the first crystallographic orientation of the Group III-N material of nanowire 904. In an embodiment, the TMD channel layer 908 has a monocrystalline structure. In an embodiment, the TMD channel layer 908 has a vertical thickness (as measured away from surfaces 904A or 904B) between 1 and 4 monolayers, corresponding to a thickness between 0.7 nm and 2.8 nm. In an exemplary embodiment, there is a single monolayer of TMD on each surface 902A, 902B, 902C and 902D.

As illustrated, TMD channel layer 908 is also on sidewall surfaces 904C and 904D. In an embodiment, the TMD channel layer 908 is lattice matched to the second crystallographic orientation of the sidewall surfaces 904C and 904D. In an embodiment, the TMD channel layer 908 on sidewall surfaces 904C and 904D, has a lateral thickness (as measured away from sidewall surface 904C and 904D, respectively) between 1 and 4 monolayers.

In the illustrative embodiment, there is a third nanowire 918 in direct contact with a template layer 118. In the illustrative embodiment, nanowire 918 has one or more properties of the nanowire 902 or 904 such as the material composition, crystallographic orientation, and lateral and vertical thicknesses, $T_V$ and $T_L$. In the illustrative embodiment, a TMD channel layer 922 is adjacent to three sides of the nanowire 918. As shown, TMD channel layer 922 is epitaxially templated off a top surface 918A and sidewall surface 918B and 918C.

In an embodiment, the TMD channel layer 922 is at least on surface 918A has a vertical thickness (as measured away from surfaces 918A) between 1 and 4 monolayers, corresponding to a thickness between 0.7 nm and 2.8 nm.

As illustrated, TMD channel layer 922 is also on sidewall surfaces 918B and 918C. In an embodiment, the TMD channel layer 922 is lattice matched to the second crystallographic orientation of the sidewall surfaces 918B and 918C. In an embodiment, the TMD channel layer 922 on sidewall surfaces 918B and 918C, has a lateral thickness (as measured away from sidewall surface 918B and 918C, respectively) between 1 and 4 monolayers.

In an exemplary embodiment, there is a single monolayer of TMD on each surface 918A, 918B and 918C.

As shown the gate dielectric layer 916 is directly adjacent to and in contact with the TMD channel layer 906, TMD channel layer 908 and TMD channel layer 922. The gate dielectric layer 916 is also directly adjacent to the template layer 118.

Referring again to FIG. 9A, the gate electrode 914 includes a gate electrode portion 914B above the nanowire 902, a gate electrode portion 914C between the nanowire 904 and nanowire 918. The different gate electrode portions 914A, 914B, and 914C are coupled electrically, by a gate portion that is out of the plane in the Figure.

In an embodiment, the source contact 910 and the drain contact 912 are each separated from the gate electrode 914 by a distance, $S_S$ and $S_D$, respectively. In the illustrative embodiment, the distances, $S_S$ and $S_D$ are at least 5 nm. In some embodiments, the distances, $S_S$ and $S_D$ are 5 nm or less. $S_S$ and $S_D$ that 5 nm are 5 nm or less is desirable to reduce external resistance in the transistor 900.

In an embodiment, a dielectric spacer 924 is adjacent to a portion of the gate electrode 914. In the illustrative embodiment, dielectric spacer 924 is in contact with gate dielectric layer 916 adjacent to gate electrode portion 914B.

The dielectric spacer 924 has a similar function as the dielectric spacer 410 described above. In addition to being advantageous from a process standpoint, the dielectric spacer 924 may also modulate a minimum $S_S$ or $S_D$.

In the illustrative embodiment, TMD channel layer 906, TMD channel layer 908 and TMD channel layer 922 do not extend to a full length (along X-direction) of the nanowires 902, 904 and 918, respectively. In some such embodiments, source contact 910 and drain contact 912 are each physically coupled with end portions of nanowires 902, 904, and 918, and electrically coupled with the TMD channel layer 906, TMD channel layer 908 and TMD channel layer 922, as is shown.

In an embodiment, the source contact 910 and the drain contact 912 each include one or more materials that are substantially the same as the materials of the source contact 800 and drain contact 802.

FIGS. 10A-16 illustrate a series of process operations to fabricate a transistor substantially similar to transistor 900, in accordance with an embodiment of the present disclosure.

Figure 10A:
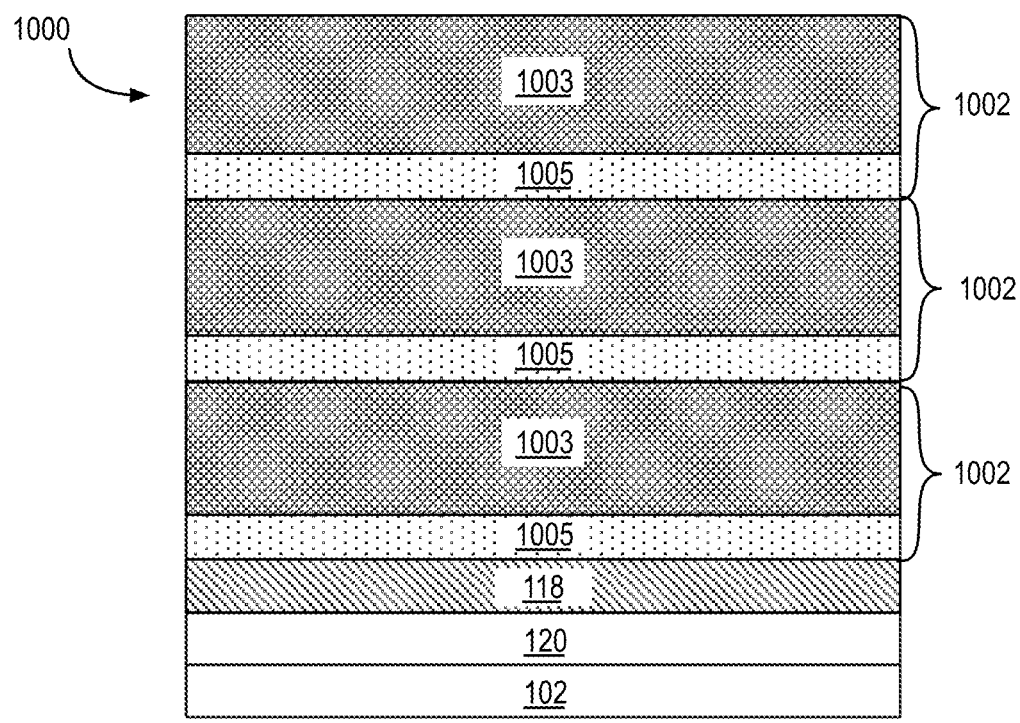
FIG. 10A is a cross-sectional illustration of a material layer stack including a plurality of bilayer stacks on a group III-Nitride template layer.

FIG. 10A is a cross-sectional illustration of a material layer stack 1000 including a plurality of bilayer stacks 1002 on a III-N template layer 118. As shown each bilayer stack 1002 includes a sacrificial III-N layer 1003 on a backbone layer 1005. In the illustrative embodiment, the block includes three bilayers. In other embodiments, the number of bilayers can range from 4-10. In an embodiment, the method and materials utilized to form buffer layer 120 on the substrate 102, and method and materials utilized to form template layer 118 on buffer layer 120 have been described above.

In the illustrative embodiment, the backbone layer 1005 is grown epitaxially on the template layer 118. In an exemplary embodiment, the backbone layer 1005 is the same or substantially the same as the material of the nanowire 918, such as AlN, or InAlN. The sacrificial III-N layer 1003 is epitaxially grown lattice matched to a crystal structure of the backbone layer 1005. In an embodiment, the sacrificial III-N layer 1003 includes Wurtzite GaN (3.189 A) and the backbone layer 1005 includes a AlN layer comprising a hexagonal wurtzite structure. As shown, the process of depositing the backbone layer 1005 and the sacrificial III-N layer 1003 is repeated three times.

Figure 10B:
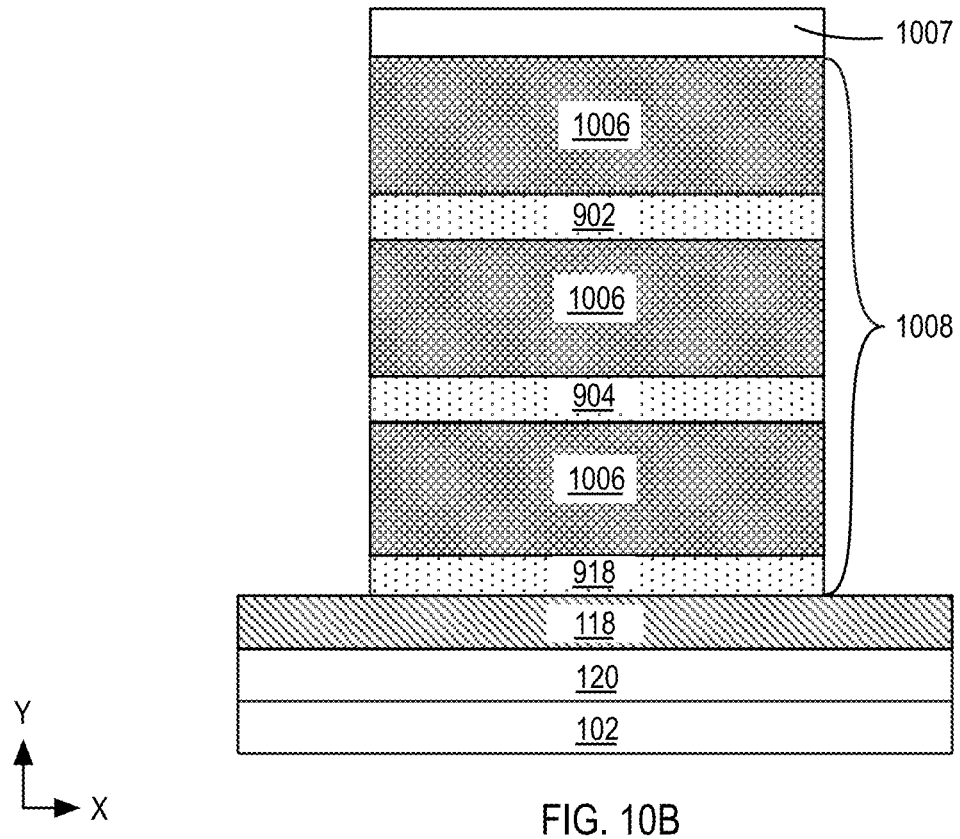
FIG. 10B illustrates the structure of FIG. 10A following the formation of a mask on the material layer stack and following the patterning of the material layer stack to form a block.

FIG. 10B illustrates the structure of FIG. 10A following the formation of a mask 1007 on the material layer stack and following the patterning of the material layer stack 1000 to form a block 1008. In an embodiment, a lithographic process is utilized to form mask 1007. In an embodiment, a plasma etch process is utilized to pattern the block 1008 to form the block 1010.

The patterning process forms nanowires 902, 904 and 918 and sacrificial III-N nanowire 1006 above each of the nanowires 902, 904 and 918. After patterning to form the block 1008, the mask 1007 may be removed. In other embodiments, the mask 1007 includes a dielectric and is not removed.

Figure 11A:
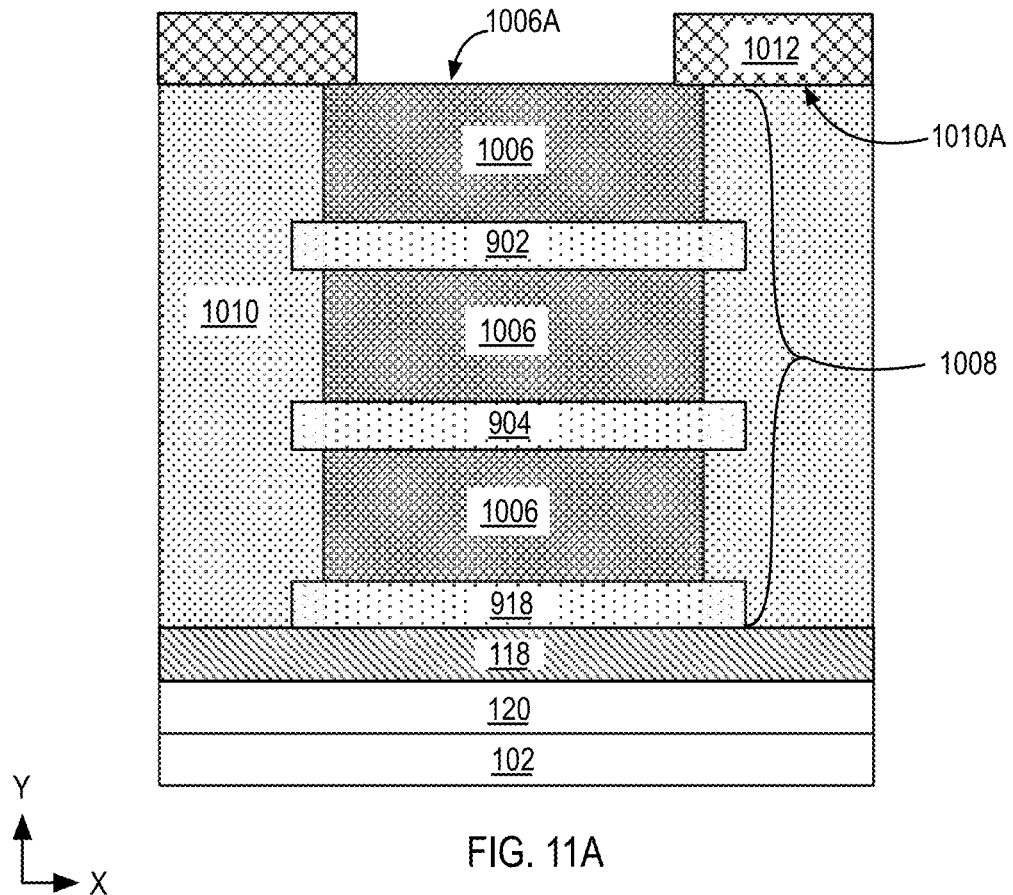
FIG. 11A illustrates the structure of FIG. 10B following the formation of a dielectric on the block and following the formation of a mask to form an opening adjacent to portions of sidewalls of the block.

FIG. 11A illustrates the structure of FIG. 10B following the formation of a dielectric 1010 on the block 1008. In an embodiment, the dielectric 1010 includes a material that can provide electrical isolation. Examples of dielectric 1010 include silicon and one or more of nitrogen, oxygen or carbon.

Figure 11B:
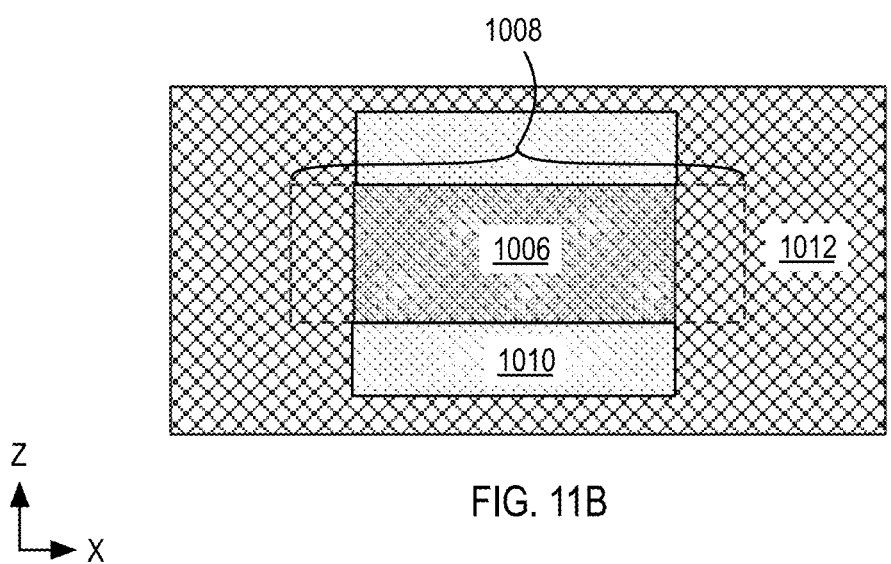
FIG. 11B is a plan-view illustration of the structure in FIG. 11A.

In the illustrative embodiment, a dielectric 1010 is deposited on and surrounds the block 1008 and is planarized. In an embodiment, dielectric 1010 is planarized using a CMP process. As shown, the dielectric 1010 may be planarized until an uppermost surface 1010A of the dielectric 1010 is coplanar or substantially coplanar with an uppermost surface 1006A of the sacrificial III-N nanowire 1006. A mask 1012 is formed on top of the dielectric 1010 and on a portion of the block 1008. A plan view of the shape of the mask 1012 and exposed block 1008 is illustrated in FIG. 11B. Dashed lines indicates that a portion of the block 1008 is covered by the mask 1012.

Figure 12A:
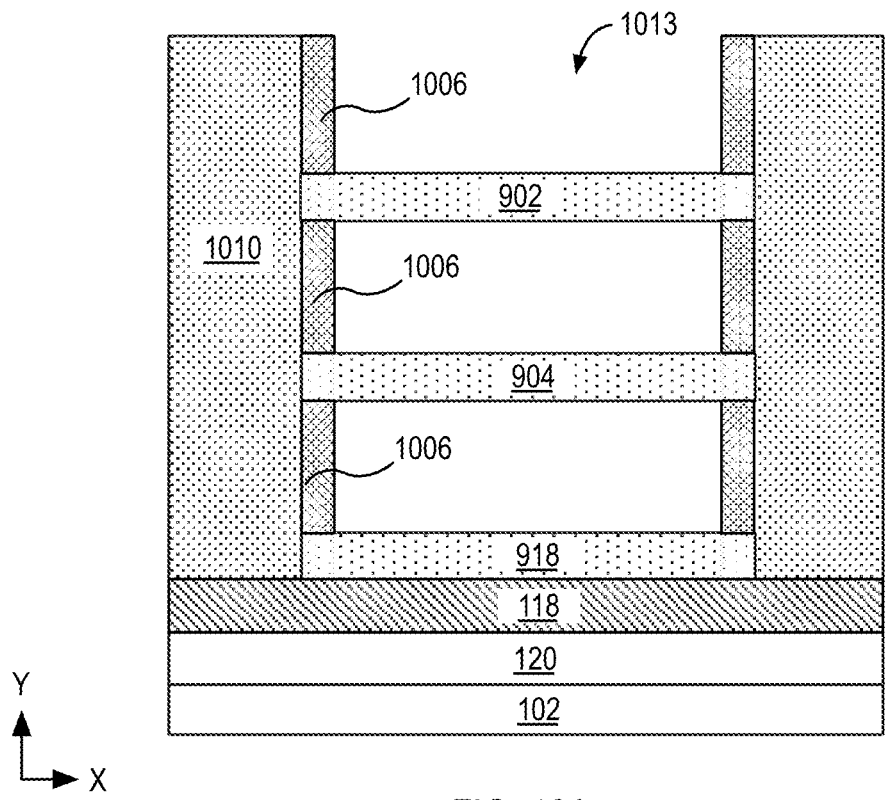
FIG. 12A is a cross-sectional illustration of a plurality of nanowires formed after etching the dielectric, exposing sidewalls of the block, and selectively removing the sacrificial III-N material.

FIG. 12A is a cross-sectional illustration of a plurality of nanowires formed above a substrate 102. In the illustrative embodiment, the dielectric 1010 is patterned and the mask 1012 is removed. The patterning process creates an opening 1013.

The plurality of sacrificial III-N nanowires 1006 are selectively removed. In an embodiment, a wet chemical etch or a vapor etch process is utilized to selectively remove the plurality of sacrificial III-N nanowires 1006 between nanowires 902 and 904 and between nanowires 904 and 918 and from above nanowire 902. The nanowires 902, 904 and 918 remain anchored to the dielectric 1010 after the selective etch process. Portions of the sacrificial III-N nanowire 1006 that were covered by the mask during the dielectric etch process may remain adjacent to the dielectric 1010, such as is illustrated.

Figure 12B:
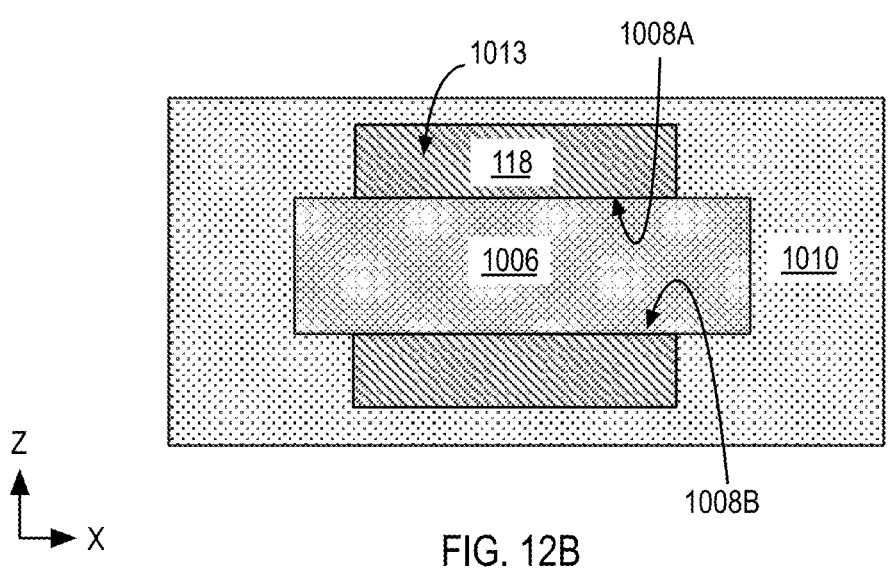
FIG. 12B is a plan-view illustration of the structure in FIG. 12A.

The etch exposes sidewalls 1008A and 1008B of the block 1008 as is shown in the plan-view illustration of FIG. 12B. Exposing the sidewalls 1008A and 1008B are important for the process of releasing the sacrificial III-N nanowire 1006. In the illustrative embodiment, removal of the sacrificial III-N nanowire 1006 exposes template layer 118.

Figure 13A:
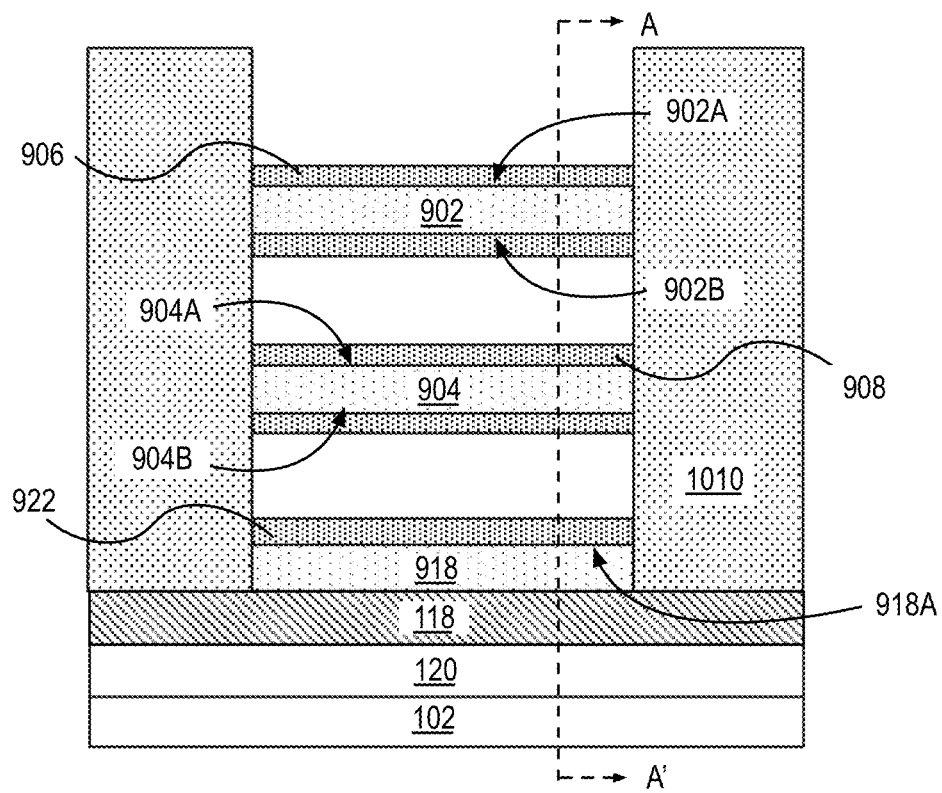
FIG. 13A is a cross-sectional illustration of the process to form a TMD channel layer on each of the nanowire.

FIG. 13A is a cross-sectional illustration of the process to form a TMD layer on each of the exposed nanowires. Prior to forming the TMD layers, the sacrificial nanowires 1006 (not shown in Figure) are removed by a wet chemical etch selective to nanowires 902, 904 and 918. In the illustrative embodiment, TMD layer 906 is deposited on all exposed surfaces of the nanowire 902. As shown TMD layer 906 is formed on top surface 902A, on bottom surface 902B. In the illustrative embodiment, the TMD layer 908 is deposited on all exposed surfaces of the nanowire 904. As shown TMD layer 908 is formed on top surface 904A and on bottom surface 904B. The TMD layer 922 is formed on top surface 918A of nanowire 918 as shown. In an embodiment, the TMD layer is synthesized by a chemical vapor deposition process (CVD) or a molecular beam epitaxy process (MOCVD) process. Depending on processing embodiments, chemical synthesis uses a solid or a gaseous precursor. In one embodiment, a CVD process utilizes solid a precursor such as a transition metal oxide and a pure chalcogen to coat exposed surface of nanowires 902, 904 and 918. CVD furnace utilized to form the TMD layer 908 is deposited at a process temperature of at least 600 degrees Celsius. In MOCVD embodiments, chemical synthesis utilizes a gaseous precursor and the TMD layer 908 is deposited at a process temperature of at least 300 degrees Celsius. In an embodiment, the process utilized to form the TMD layer forms a single monolayer of TMD layer 906, a single monolayer of TMD layer 908 and a single monolayer of TMD layer 922. Each of the TMD layers 906, 908 and 922 include a same material and formed to a same thickness. In other embodiments, 2 and 4 monolayers of TMD layers are formed on each nanowire 902, 904 and 918.

Figures 13B, 13C:
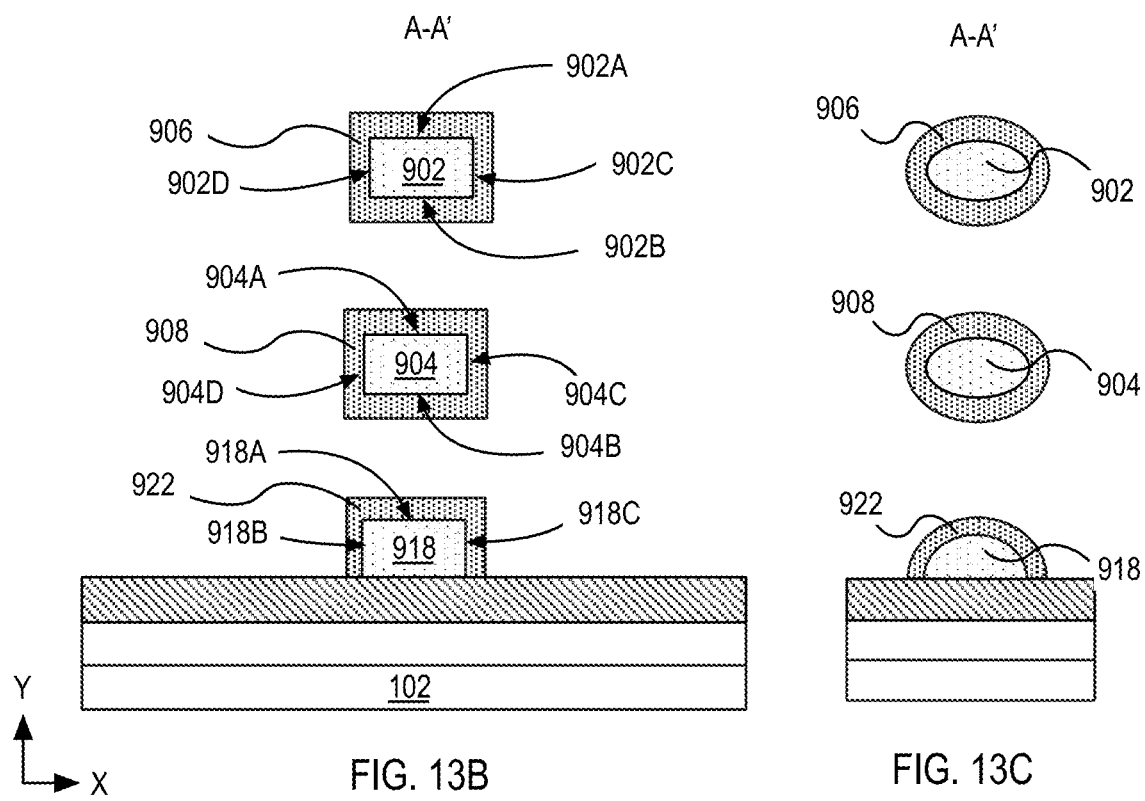
FIG. 13B is a cross-sectional illustration along a line A-A' through the structure in FIG. 13A.
FIG. 13C is a cross-sectional illustration of a plurality of nanowires having a substantially circular profile, in accordance with an embodiment of the present disclosure.

FIG. 13B is a cross-sectional illustration along a line A-A' through the structure in FIG. 13A. In the illustrative embodiment, the nanowires 902, 904 and 918 each have a rectangular cross section and the TMD layer 906 and 908 surrounds the nanowire 902 and 904, respectively.

As shown TMD layer 906 is formed on top surface 902A, on bottom surface 902B, sidewalls 902C and 902D. In the illustrative embodiment, the TMD layer 908 is deposited on all exposed surfaces of the nanowire 904. As shown TMD layer 908 is formed on top surface 904A, on bottom surface 904B, sidewalls 904C and 904D. The TMD layer 922 is formed on top surface 918A, and on sidewalls 918B and 918C of nanowire 918 as shown.

In other embodiments, the cross-sectional profile is substantially circular, such as is illustrated in FIG. 13C. In some such embodiments, the TMD layer 906 and 908 surrounds the nanowire 902 and 904, respectively. As shown, nanowire 918 may be partially circular and have a flat base. The TMD layer 922 may also be formed on a substantially circular nanowire 918 as shown.

Figure 14A:
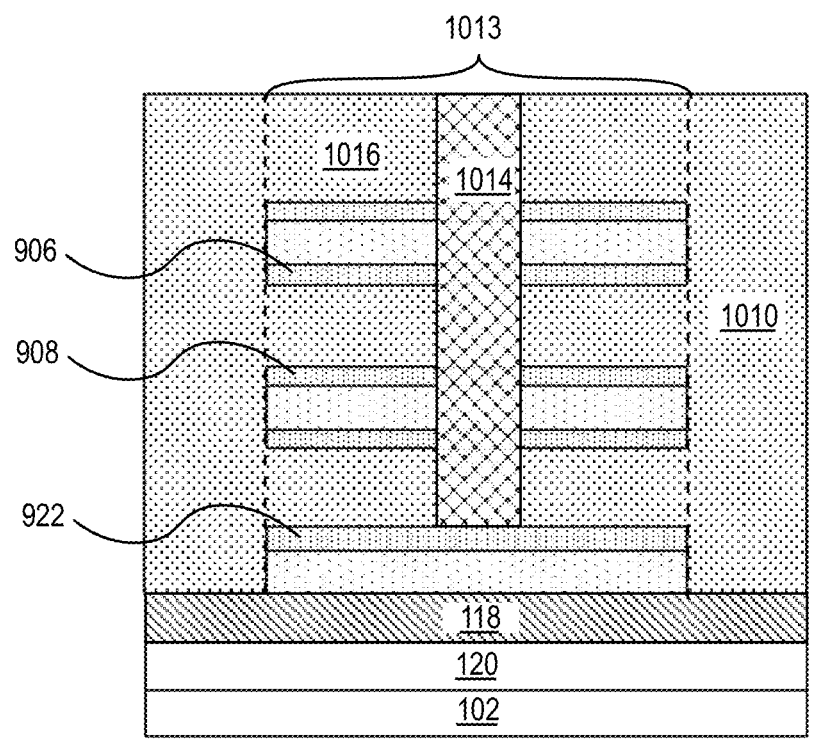
FIG. 14A is a cross-sectional illustration of the structure in FIG. 13A following the formation of a dummy gate structure in the opening and following the deposition of dielectric after formation of the dummy gate structure.

FIG. 14A is a cross-sectional illustration of the structure in FIG. 13A following the formation of a dummy gate structure 1014 in the opening 1013 and following the deposition of dielectric 1016. In an embodiment, a polycrystalline silicon layer is deposited into the opening 1013. The polycrystalline silicon layer is planarized and patterned into a dummy gate structure 1014. After the formation of the dummy gate structure 1014 a dielectric 1016 is blanket deposited into the opening 1013 and planarized. In some embodiments, the dielectric 1016 includes silicon and one or more of nitrogen, oxygen or carbon. The material of the dielectric 1016 may affect the capacitance in a nanowire transistor to be formed. In one embodiment, the dielectric 1016 is a silicon nitride. In other embodiments, the dielectric 1016 is silicon oxide or silicon carbide.

Figure 14B:
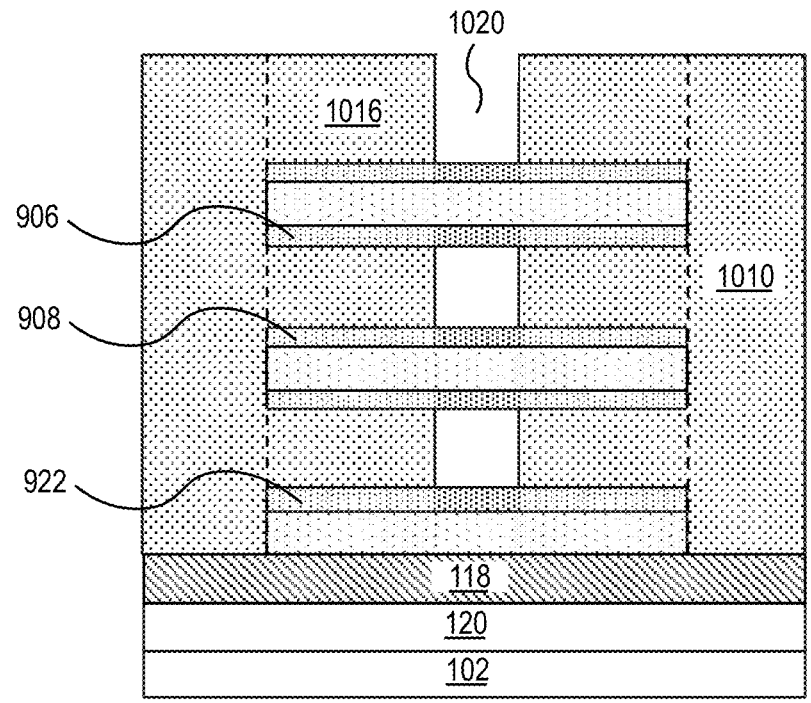
FIG. 14B illustrates the structure of FIG. 14A following the removal of the dummy gate structure.

FIG. 14B illustrates the structure of FIG. 14A following the removal of the dummy gate structure 1014 (not shown in Figure). In an embodiment, a plasma etch may be performed to remove a first portion of the dummy gate structure 1014, followed by a wet chemical process to remove a remaining second portion. The dummy gate structure 1014 must be removed from regions between the TMD layer 906 and TMD layer 908, and between TMD layer 908 and TMD layer TMD layer 922. The removal of the dummy gate structure 1014 creates an opening 1020.

Figure 15A:
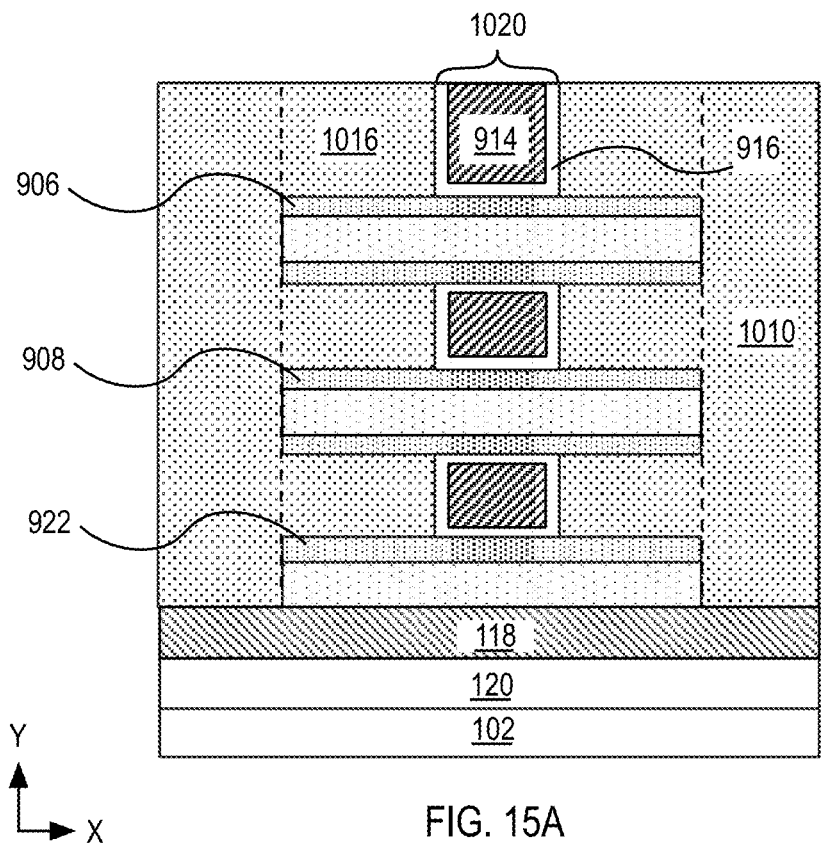
FIG. 15A illustrates the structure of FIG. 14B following the formation of a gate structure in the opening.

FIG. 15A illustrates the structure of FIG. 14B following the formation of a gate structure in the opening 1020. In an embodiment, the process begins by forming a gate dielectric layer 916 in the opening 1020 on all exposed surfaces of the TMD layer 906, 908 and 918. In an embodiment, the gate dielectric layer 916 is deposited by an atomic layer deposition (ALD) process. The ALD process forms a conformal layer of gate dielectric layer 916 on surfaces of the TMD layer 906, 908 and 918, and on the template layer 118, on the dielectric 1016 and on uppermost surface of dielectric 1010. In an embodiment, the gate dielectric layer 916 is deposited to a thickness between 0.8 nm and 2 nm. Material for a gate electrode 914 is deposited on the gate dielectric layer 916 in the opening 1020 and above the dielectric 1010 and 1016. In an embodiment, an ALD process is utilized to form the gate electrode material between the TMD layers 906 and TMD layer 908 and between TMD layer 908 and TMD layer 922.

Figure 15B:
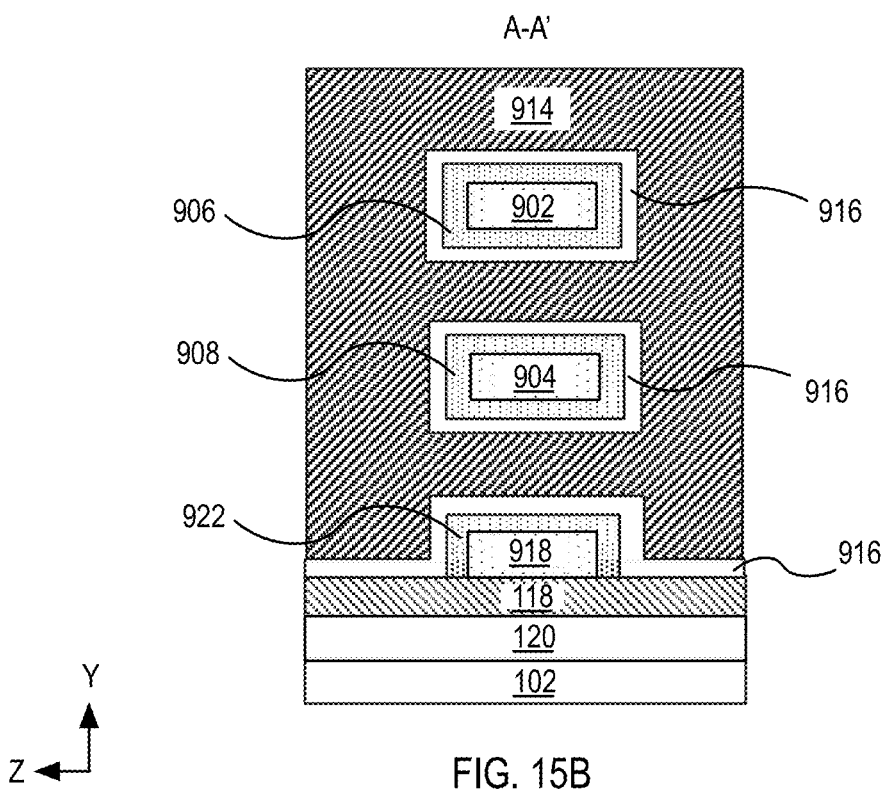
FIG. 15B is a cross sectional illustration through a line A-A' in FIG. 15A.

FIG. 15B is a cross sectional illustration through a line A-A' in FIG. 15A. In an embodiment, the gate electrode 914 is a single connected continuous portion, as shown.

Figure 16:
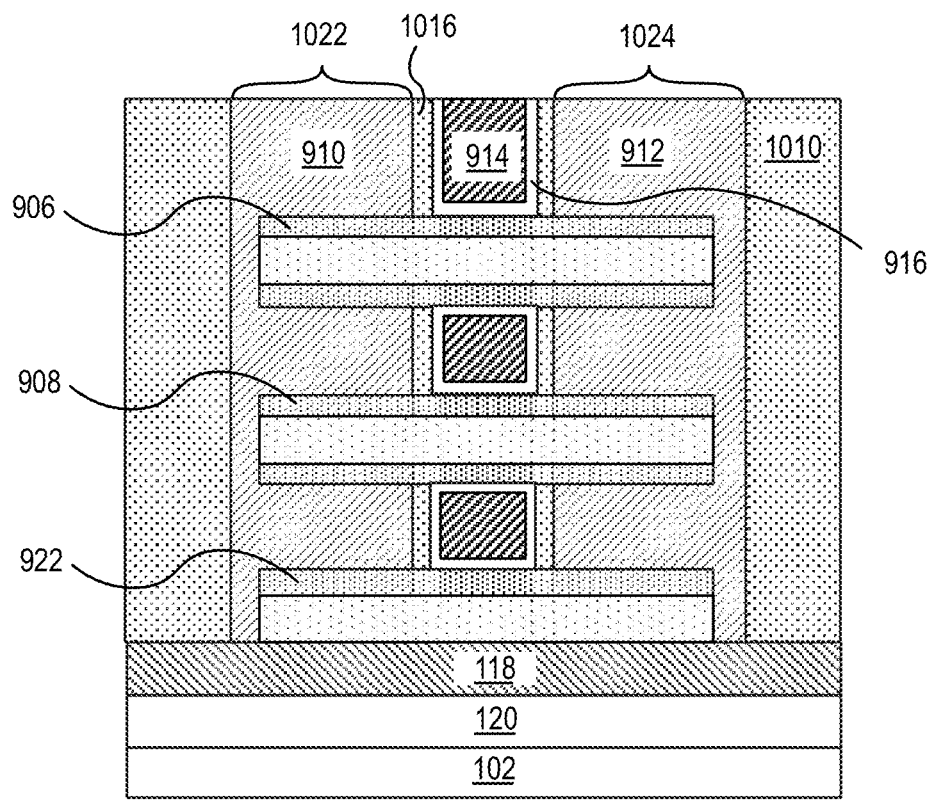
FIG. 16 is a cross-sectional illustration of the structure in FIG. 15A following the formation of a source contact on one end of a plurality of TMD channel layers and a drain contact on a second end of the plurality of TMD channel layers, in accordance with an embodiment of the present disclosure.

FIG. 16 is a cross-sectional illustration of the structure in FIG. 15A following the formation of a source contact 910 and the drain contact 912. In an embodiment, the method to form source contact 910 and the drain contact 912 is substantially similar to the process utilized in forming source contact 800 and drain contact 802 described in association with FIG. 8. Referring again to FIG. 16, in an embodiment, an opening 1022 are formed to expose one end of the TMD layer 906, 908 and 918 and an opening 1024 is formed to expose a second end of the TMD layer 906, 908 and 918. I am embodiment, a plasma etch process is utilized to form openings 1022 and 1024 after the formation of a mask on the dielectric 1010 and 1016, on the gate dielectric layer 916 and on the gate electrode 914. In an embodiment, the openings 1022 and 1024 can extend to gate dielectric layer 916. In an embodiment, the dielectric 1010 and the dielectric 1016 is etched by a plasma etch process to form openings 1022 and 1022.

In an embodiment, the plasma etch process has sufficient anisotropy component to remove the dielectric layer 1016 from regions between TMD layers 906 and 908, and between TMD layers 908 and 918.

In an embodiment, one or more layers of contact material are blanket deposited on exposed surfaces of the TMD layers 906, 908 and 918 and on uppermost surface of the dielectric 1010 and 1016, on gate dielectric layer 916 and on gate electrode 914. In an embodiment, the contact material includes one or more materials that are substantially the same as the material of the source contact 108 and drain contact 110 described above. In an embodiment, a first of the one or more contact materials is epitaxial to the monocrystalline TMD layers 906, 908 and 918.

In an embodiment, a planarization process is utilized to remove the excess one or more layers of contact material formed on uppermost surface of the dielectric 1016, dielectric 1010, gate dielectric layer 916 and gate electrode 914. The planarization process forms source contact 910 and drain contact 912.

Figure 17A:
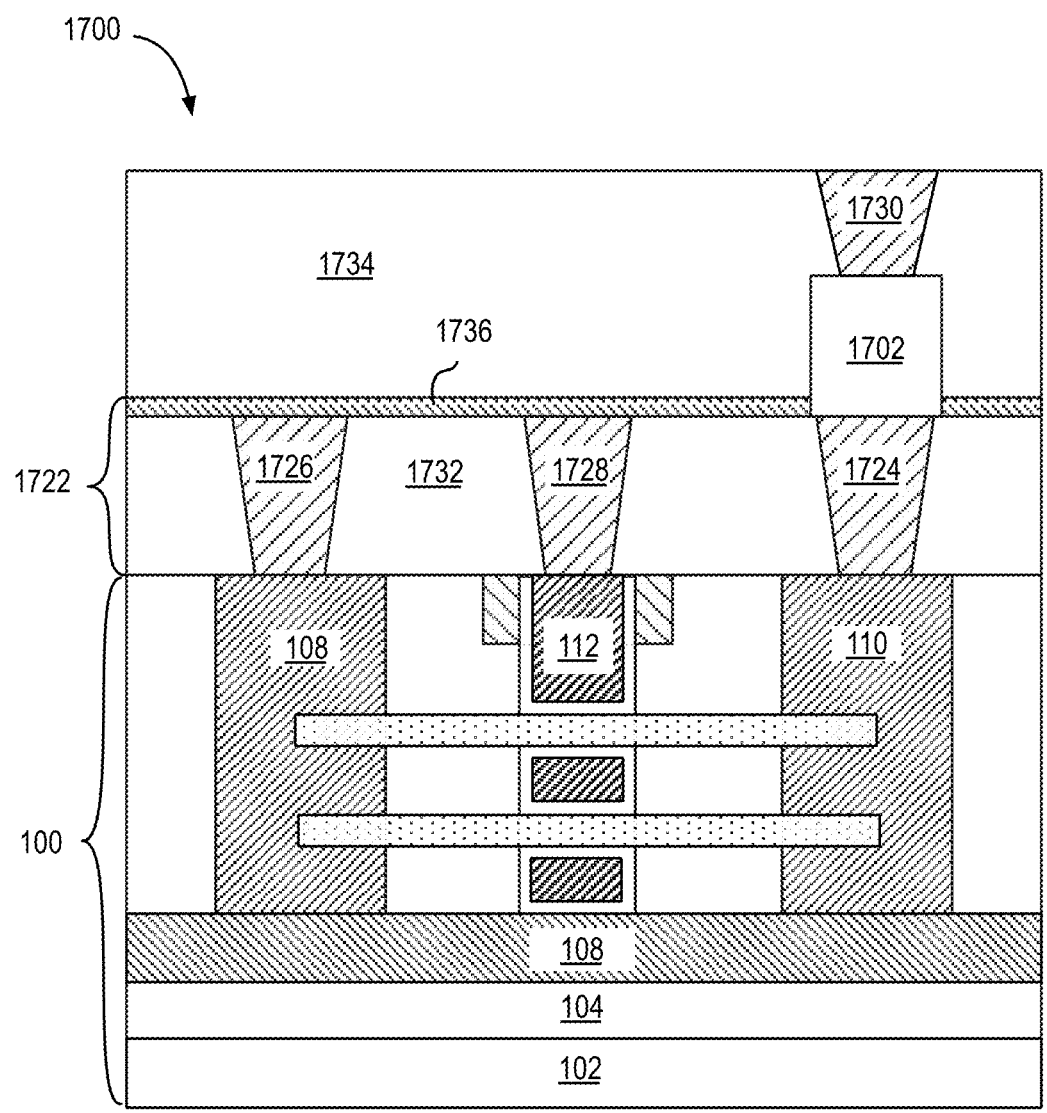
FIG. 17A is a cross-sectional illustration of a memory device coupled with a transistor including a plurality of TMD channels, in accordance with an embodiment of the present disclosure.

FIG. 17A illustrates a cross-sectional view of a memory cell 1700 including a nanowire transistor with a plurality of TMD channels, such as the transistor 100 described in association with FIGS. 1A and 1B and a non-volatile memory element 1702 coupled to a contact of the transistor 100. In the illustrative embodiment, the non-volatile memory element 1702 is coupled to the drain contact 110 of the transistor 100.

Non-volatile memory element 1702 may include a magnetic tunnel junction (MTJ) device, a conductive bridge random access memory (CBRAM) device, or a resistive random-access memory (RRAM) device. A non-volatile memory element such as an MTJ device requires a nominal critical switching current, that depends on an MTJ device area, to undergo magnetization switching. As an MTJ is scaled down in size, the critical switching current required to switch the memory state of the MTJ device also scales proportionally with device area, however scaling MTJ's presents numerous challenges. If a transistor connected to an MTJ device can deliver an amount of current that exceeds critical switching current requirement of the MTJ device, then feature size scaling of MTJ devices can be relaxed. In an embodiment, transistor 100, which can provide an additional current boost (through increase in drive current), can be advantageously coupled to non-volatile memory element 1702 such as an MTJ device to overcome any larger critical switching current requirements.

Figure 17B:
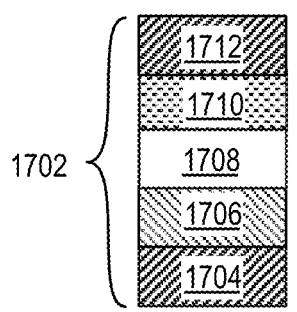
FIG. 17B is a cross-sectional illustration of a magnetic tunnel junction device, in accordance with an embodiment of the present disclosure.

FIG. 17B illustrates a cross-sectional view of an example non-volatile memory element 1702 that includes a magnetic tunnel junction (MTJ) material device. In the illustrated embodiment, the MTJ device includes a bottom electrode 1704, a fixed magnet 1706 above the bottom electrode 1704, a tunnel barrier 1708 on the fixed magnet 1706, a free magnet 1710 on the tunnel barrier 1708, and a top electrode 1712 on the free magnet 1710. In an embodiment, a dielectric spacer laterally surrounds (not shown) non-volatile memory element 1702.

In an embodiment, fixed magnet 1706 includes a material and has a thickness sufficient for maintaining a fixed magnetization. For example, fixed magnet 1706 may include an alloy such as CoFe and CoFeB. In an embodiment, fixed magnet 1706 includes $Co_{100-x-y}Fe_xB_y$, where X and Y each represent atomic percent such that X is between 50 and 80 and Y is between 10 and 40, and the sum of X and Y is less than 100. In an embodiment, X is 60 and Y is 20. In an embodiment, fixed magnet 1706 is FeB, where the concentration of boron is between 10 and 40 atomic percent of the total composition of the FeB alloy. In an embodiment, the fixed magnet 1706 has a thickness that is between 1 nm and 2.5 nm.

In an embodiment, tunnel barrier 1708 is composed of a material suitable for allowing electron current having a majority spin to pass through tunnel barrier 1708, while impeding, at least to some extent, electron current having a minority spin from passing through tunnel barrier 1708. Thus, tunnel barrier 1708 (or spin filter layer) may also be referred to as a tunneling layer for electron current of a particular spin orientation. In an embodiment, tunnel barrier 1708 includes a material such as, but not limited to, magnesium oxide (MgO) or aluminum oxide ($Al_2O_{17}$). In an embodiment, tunnel barrier 1708 including MgO has a crystal orientation that is (001) and is lattice matched to free magnet 1710 below tunnel barrier 1708 and fixed magnet 1706 above tunnel barrier 1708. In an embodiment, tunnel barrier 1708 is MgO and has a thickness is between 1 nm to 2 nm.

In an embodiment, free magnet 1710 includes a magnetic material such as Co, Ni, Fe or alloys of these materials. In an embodiment, free magnet 1710 includes a magnetic material such as FeB, CoFe and CoFeB. In an embodiment, free magnet 1710 includes a $Co_{100-x-y}Fe_xB_y$, where X and Y each represent atomic percent such that X is between 50 and 80 and Y is between 10 and 40, and the sum of X and Y is less than 100. In an embodiment, X is 60 and Y is 20. In an embodiment, free magnet 1710 is FeB, where the concentration of boron is between 10 and 40 atomic percent of the total composition of the FeB alloy. In an embodiment, free magnet 1710 has a thickness that is between 1 nm and 2.0 nm.

In an embodiment, bottom electrode 1704 includes an amorphous conductive layer. In an embodiment, bottom electrode 1704 is a topographically smooth electrode. In an embodiment, bottom electrode 1704 includes a material such as W, Ta, TaN or TiN. In an embodiment, bottom electrode 1704 is composed of Ru layers interleaved with Ta layers. In an embodiment, bottom electrode 1704 has a thickness between 20 nm and 50 nm. In an embodiment, top electrode 1712 includes a material such as W, Ta, TaN or TiN. In an embodiment, top electrode 1712 has a thickness between 30 nm and 70 nm. In an embodiment, bottom electrode 1704 and top electrode 1712 are the same metal such as Ta or TiN. In an embodiment, the MTJ device has a combined total thickness of the individual layers is between 60 nm and 100 nm and a width is between 10 nm and 50 nm.

Referring again to FIG. 17A, in an embodiment, non-volatile memory element 1702 is a resistive random-access memory (RRAM) that operates on the principle of filamentary conduction. When an RRAM device undergoes an initial voltage breakdown, a filament is formed in a layer known as a switching layer. The size of the filament depends on the magnitude of the breakdown voltage and reliable switching between different resistance states in a filamentary RRAM device can be greatly enhanced at larger current. In an embodiment, transistor 100, that can provide an additional current boost (through increase in drive current), can be advantageously coupled to an RRAM device to provide reliable switching operation.

Figure 17C:
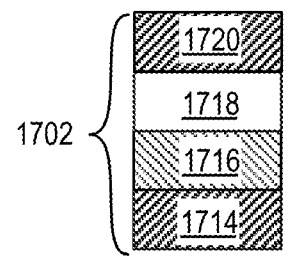
FIG. 17C is a cross-sectional illustration of a resistive random-access memory device, in accordance with an embodiment of the present disclosure.

FIG. 17C illustrates a cross-sectional view of an example non-volatile memory element 1702 that includes a resistive random-access memory (RRAM) device. In the illustrated embodiment, the RRAM material stack includes a bottom electrode 1714, a switching layer 1716 over the bottom electrode 1714, an oxygen exchange layer 1718 over the switching layer 1716, and a top electrode 1720 on the oxygen exchange layer 1718.

In an embodiment, bottom electrode 1714 includes an amorphous conductive layer. In an embodiment, bottom electrode 1714 is a topographically smooth electrode. In an embodiment, bottom electrode 1714 includes a material such as W, Ta, TaN or TiN. In an embodiment, bottom electrode 1714 is composed of Ru layers interleaved with Ta layers. In an embodiment, bottom electrode 1714 has a thickness is between 20 nm and 50 nm. In an embodiment, top electrode 1720 includes a material such as W, Ta, TaN or TiN. In an embodiment, top electrode 1720 has a thickness is between 170 and 70 nm. In an embodiment, bottom electrode 1714 and top electrode 1720 are the same metal such as Ta or TiN.

Switching layer 1716 may be a metal oxide, for example, including oxygen and atoms of one or more metals, such as, but not limited to Hf, Zr, Ti, Ta or W. In the case of titanium or hafnium, or tantalum with an oxidation state +4, switching layer 1716 has a chemical composition, $MO_X$, where O is oxygen and X is or is substantially close to 2. In the case of tantalum with an oxidation state +5, switching layer 1716 has a chemical composition, $M_2O_X$, where O is oxygen and X is or is substantially close to 5. In an embodiment, switching layer 1716 has a thickness is between 1 nm and 5 nm.

Oxygen exchange layer 1718 acts as a source of oxygen vacancy or as a sink for $O^{2-}$. In an embodiment, oxygen exchange layer 1718 is composed of a metal such as but not limited to, hafnium, tantalum or titanium. In an embodiment, oxygen exchange layer 1718 has a thickness is between 5 nm and 20 nm. In an embodiment, the thickness of oxygen exchange layer 1718 is at least twice the thickness of switching layer 1716. In another embodiment, the thickness of oxygen exchange layer 1718 is at least twice the thickness of switching layer 1716. In an embodiment, the RRAM device has a combined total thickness of the individual layers is between 60 nm and 100 nm and width is between 10 nm and 50 nm.

Referring again to FIG. 17, the memory device 1702 is coupled to the transistor 100 through interconnect structures at a level 1722 above the transistor. In an embodiment, level 1722 includes a single level of interconnects coupled with the transistor 100. In other embodiments, level 1722 includes a plurality of sublevels of interconnect routing structures.

In the illustrative embodiment, the memory cell 1700 includes a drain interconnect 1724 between the memory device 1702 and the drain contact 110. As shown, the drain interconnect 1724 is on and coupled with the drain contact 110. The memory cell 1700 further includes a source interconnect 1726 coupled with the source contact 108 and gate interconnect 1728 coupled with the gate 112. In other embodiments, a gate contact is between the gate 112 and the gate interconnect 1728. The memory device 1702 is further coupled to a memory interconnect 1730.

In an embodiment, source interconnect 1726, gate interconnect 1728 and drain interconnect 1724 are embedded in a dielectric layer 1732. In an embodiment, the source interconnect 1726, gate interconnect 1728, drain interconnect 1724 and memory interconnect 1730 each include titanium, tantalum, tungsten, ruthenium, copper, or nitrides of titanium, tantalum, tungsten, ruthenium. In other embodiments the source interconnect 1726, gate interconnect 1728, drain interconnect 1724 and memory interconnect 1730, include a liner layer including ruthenium or tantalum and a fill metal such as copper or tungsten. In the illustrative embodiment, the memory device 1702 and the memory interconnect 1730 is embedded in a dielectric 1734.

In an embodiment, the level 1722 further includes a barrier dielectric layer 1736 between the dielectric 1732 and dielectric 1734. In embodiments dielectric 1732 and 1734 include silicon and one or more of nitrogen, oxygen and carbon such as, silicon nitride, silicon dioxide, carbon doped silicon nitride, silicon oxynitride or silicon carbide.

In embodiments, dielectric 1736 includes silicon and one or more of nitrogen and carbon such as, silicon nitride, carbon doped silicon nitride or silicon carbide.

Figure 18:
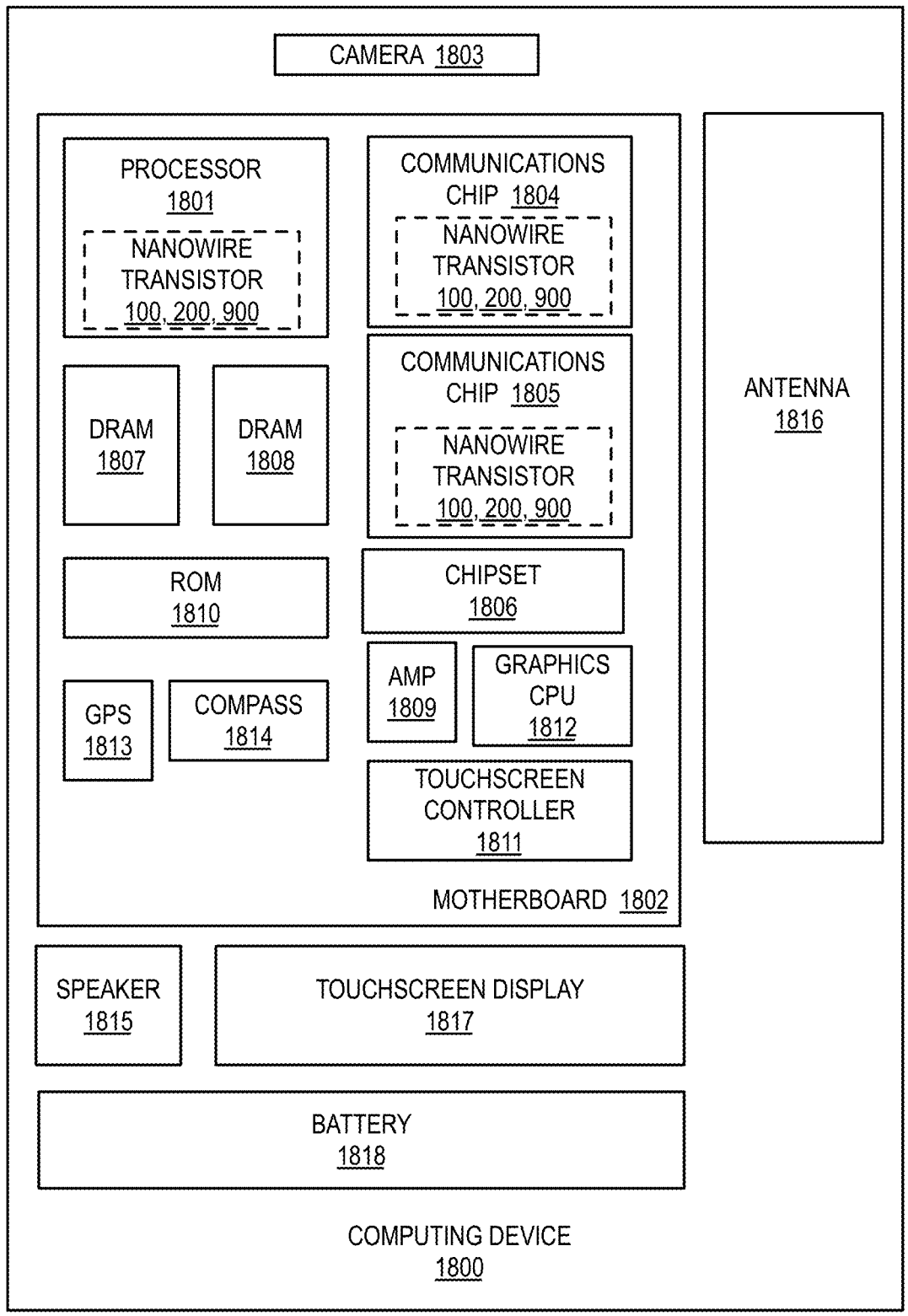
FIG. 18 illustrates a computing device in accordance with embodiments of the present disclosure.

FIG. 18 illustrates a computing device 1800 in accordance with embodiments of the present disclosure. As shown, computing device 1800 houses a motherboard 1802. Motherboard 1802 may include a number of components, including but not limited to a processor 1801 and at least one communications chip 1804 or 1805. Processor 1801 is physically and electrically coupled to the motherboard 1802. In some implementations, communications chip 1805 is also physically and electrically coupled to motherboard 1802. In further implementations, communications chip 1805 is part of processor 1801.

Depending on its applications, computing device 1800 may include other components that may or may not be physically and electrically coupled to motherboard 1802. These other components include, but are not limited to, volatile memory (e.g., DRAM), non-volatile memory (e.g., ROM), flash memory, a graphics processor, a digital signal processor, a crypto processor, a chipset 1806, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communications chip 1805 enables wireless communications for the transfer of data to and from computing device 1800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 1805 may implement any of a number of wireless standards or protocols, including but not limited to Wi-Fi (IEEE 801.11 family), WiMAX (IEEE 801.11 family), long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 1800 may include a plurality of communications chips 1804 and 1805. For instance, a first communications chip 1805 may be dedicated to shorter range wireless communications such as Wi-Fi and Bluetooth and a second communications chip 1804 may be dedicated to longer range wireless communications such as GPS, EDGE, GPRS, CDMA, WiMAX, LTE, Ev-DO, and others.

Processor 1801 of the computing device 1800 includes an integrated circuit die packaged within processor 1801. In some embodiments, the integrated circuit die of processor 1801 includes one or more interconnect structures, non-volatile memory devices, and transistors such as TMD nanowire transistors 100, 200 or 900 FIG. 1A, 2A or 9A, respectively. Referring again to FIG. 18, the term "processor" may refer to any device or portion of a device that processes electronic data from registers and/or memory to transform that electronic data into other electronic data that may be stored in registers and/or memory.

Communications chip 1805 also includes an integrated circuit die packaged within communication chip 1805. In another embodiment, the integrated circuit die of communications chips 1804, 1805 includes one or more interconnect structures, non-volatile memory devices, capacitors and transistors such as TMD nanowire transistors 100, 200 or 900, described above. Depending on its applications, computing device 1800 may include other components that may or may not be physically and electrically coupled to motherboard 1802. These other components may include, but are not limited to, volatile memory (e.g., DRAM) 1807, 1808, non-volatile memory (e.g., ROM) 1810, a graphics CPU 1812, flash memory, global positioning system (GPS) device 1813, compass 1814, a chipset 1806, an antenna 1816, a power amplifier 1809, a touchscreen controller 1811, a touchscreen display 1817, a speaker 1815, a camera 1803, and a battery 1818, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 1800 and discussed above may contain a stand-alone integrated circuit memory die that includes one or more arrays of NVM devices.

In various implementations, the computing device 1800 may be a laptop, a netbook, a notebook, an Ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 1800 may be any other electronic device that processes data.

Figure 19:
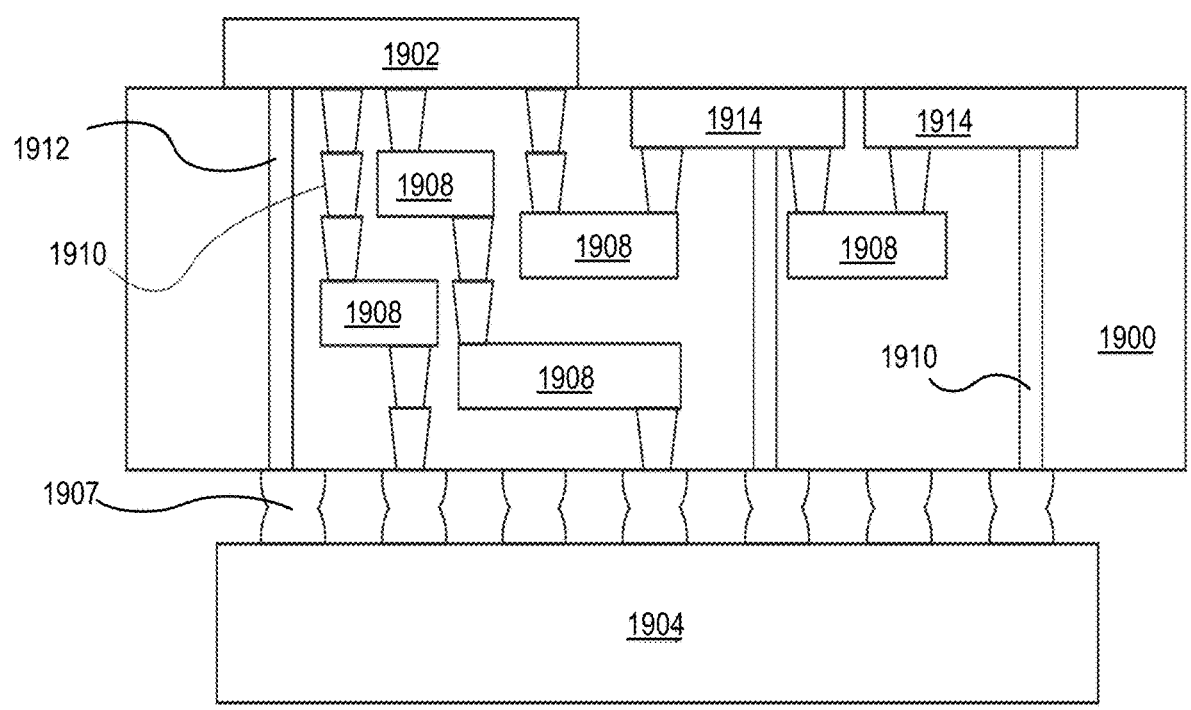
FIG. 19 illustrates an integrated circuit (IC) structure that includes one or more embodiments of the present disclosure.

FIG. 19 illustrates an integrated circuit (IC) structure 1900 that includes one or more embodiments of the disclosure. The integrated circuit (IC) structure 1900 is an intervening substrate used to bridge a first substrate 1902 to a second substrate 1904. The first substrate 1902 may be, for instance, an integrated circuit die. The second substrate 1904 may be, for instance, a memory module, a computer mother, or another integrated circuit die. Generally, the purpose of an integrated circuit (IC) structure 1900 is to spread a connection to a wider pitch or to reroute a connection to a different connection. For example, an integrated circuit (IC) structure 1900 may couple an integrated circuit die to a ball grid array (BGA) 1907 that can subsequently be coupled to the second substrate 1904. In some embodiments, the first substrate 1902 and the second substrate 1904 are attached to opposing sides of the integrated circuit (IC) structure 1900. In other embodiments, the first substrate 1902 and the second substrate 1904 are attached to the same side of the integrated circuit (IC) structure 1900. And in further embodiments, three or more substrates are interconnected by way of the integrated circuit (IC) structure 1900.

The integrated circuit (IC) structure 1900 may be formed of an epoxy resin, a fiberglass-reinforced epoxy resin, a ceramic material, or a polymer material such as polyimide. In further implementations, the integrated circuit (IC) structure may be formed of alternate rigid or flexible materials that may include the same materials described above for use in a semiconductor substrate, such as silicon, germanium, and other group III-V and group IV materials.

The integrated circuit (IC) structure may include metal interconnects 1908 and vias 1910, including but not limited to through-silicon vias (TSVs) 1912. The integrated circuit (IC) structure 1900 may further include embedded devices 1914, including both passive and active devices. Such embedded devices 1914 include capacitors, decoupling capacitors, resistors, inductors, fuses, diodes, transformers, device structure including transistors, such as TMD nanowire transistors 100, 200 or 900 as described in FIG. 1A, 2A or 9A, respectively. Referring again to FIG. 19, the integrated circuit (IC) structure 1900 may further include embedded devices 1914 such as one or more resistive random-access devices, sensors, and electrostatic discharge (ESD) devices. More complex devices such as radiofrequency (RF) devices, power amplifiers, power management devices, antennas, arrays, sensors, and MEMS devices may also be formed on the integrated circuit (IC) structure 1900.

Thus, one or more embodiments of the present disclosure relate to TMD nanowire transistors such as 100, 200 or 900 as described above. The TMD nanowire transistors 100, 200 or 900 may be used in various integrated circuit applications.

In a first example, a transistor structure includes a first channel layer over a second channel layer, where the first and the second channel layers include a monocrystalline transition metal dichalcogenide (TMD). The transistor structure further includes a source material coupled to a first end of the first and second channel layers, a drain material coupled to a second end of the first and second channel layers, a gate electrode between the source material and the drain material, and between the first channel layer and the second channel layer and a gate dielectric between the gate electrode and each of the first channel layer and the second channel layer.

In second examples, for any of first examples, where the TMD of the first channel layer has a first crystal orientation, and the TMD of the second channel layer has the first crystal orientation.

In third examples, for any of the first through second examples, where the each of the first channel layer and the second channel layer further include a plurality of stacked 2-dimensional TMD layers.

In fourth examples, for any of the first through third examples, the TMD includes at least one of molybdenum, tungsten or chromium, and at least one of sulfur, selenium or tellurium.

In fifth examples, for any of the first through fourth examples where the first channel layer and the second channel layer have a thickness between 1 and 4 monolayers.

In sixth examples, for any of the first through fifth examples, where each of the first and second channel layers have a first thickness along a first direction orthogonal to a longitudinal length, where each of the first and second channel layers have a second thickness along a second direction orthogonal to the first direction and to the longitudinal length, where the first thickness is between 5 nm and 60 nm, and where the second thickness is between 1 and 4 monolayers.

In seventh examples, for any of the first through sixth examples, the gate electrode is directly adjacent to a first portion of the gate dielectric on a top surface of the first channel layer and directly adjacent a second portion of the gate dielectric on a bottom surface of the second channel layer.

In eighth examples, for any of the first through seventh examples, the source material and the drain material are epitaxial to the monocrystalline transition metal dichalcogenide (TMD).

In ninth examples, a transistor includes a first nanowire above a second nanowire, where the first and the second nanowires include a crystal of a Group III-Nitride (III-N) material, a first channel layer including a monocrystalline transition metal dichalcogenide (TMD) directly adjacent the first nanowire, a second channel layer including the monocrystalline TMD directly adjacent the second nanowire. The transistor further includes a source material coupled to a first end of the first and second channel layers, a drain material coupled to a second end of the first and second channel layers, a gate electrode between the source material and the drain material and between the first nanowire and the second nanowire, and a gate dielectric between the gate electrode and each of the first channel layer and the second channel layer.

In tenth examples, for any of the ninth examples, the TMD of the first channel layer has a first crystal orientation, and the TMD of the second channel layer has the first crystal orientation, and where the TMD of the first channel layer and the TMD of the second channel layer are lattice matched to the crystal of the III-N material.

In eleventh examples, for any of the ninth through tenth examples, the TMD includes at least one of molybdenum, tungsten or chromium, and at least one of sulfur, selenium or tellurium and the III-N material includes nitrogen and at least one of Al or In.

In twelfth examples, for any of the ninth through eleventh examples, each of the first nanowire and the second nanowire have a first thickness along a first direction orthogonal to a longitudinal length, wherein each of the first nanowire and the second nanowire have a second thickness along a second direction orthogonal to the first direction and to the longitudinal length, wherein the first thickness is between 5 nm and 60 nm, and wherein the second thickness is between 4 and 8 nm.

In thirteenth examples, for any of the ninth through twelfth examples, the first channel layer is on a top surface and on a bottom surface of the first nanowire and the second channel layer is on a top surface and on a bottom surface of the second nanowire.

In a fourteenth example, for any of the ninth through thirteenth examples, the gate electrode is above the top surface of the first nanowire and below the bottom surface of the second nanowire and the gate dielectric is between the gate electrode and the first channel layer above the top surface of the first nanowire and between the gate electrode and the second channel layer below the bottom surface of the second nanowire.

In fifteenth examples, for any of the ninth through fourteenth examples, each of the first channel layer and the second channel layer have a thickness between 1 and 4 monolayers In sixteenth examples, for any of the ninth through fifteenth examples, the first channel layer is further on a sidewall surface of the first nanowire and the second channel layer is further on a sidewall surface of the second nanowire.

In seventeenth examples, a method of fabricating a transistor, the method includes forming a material layer stack including a layer of a III-N material on a plurality of bilayers, where each bilayer is formed by depositing a channel layer including a monocrystalline transition metal dichalcogenide (TMD) on a layer of the III-N material. The method further includes patterning a material layer stack into a block, forming a dummy gate over a first portion of the block and forming a dielectric adjacent the dummy gate and adjacent to the block, wherein the dielectric comprises a first portion adjacent to one sidewall of the dummy gate and a second portion adjacent to a second sidewall of the dummy gate, opposite to the first sidewall. The method further includes etching and removing the dummy gate, etching and removing the layer of III-N material adjacent to the channel layer in the plurality of bilayers between the first and the second dielectric to form a plurality of channel layers and forming a gate dielectric on each of the plurality of channel layers. The method further includes forming a gate electrode on the gate dielectric layer, forming a first opening over one end of the block and a second opening on a second end of the block where the first opening and the second opening are separated by the gate electrode and forming a first contact in the first opening and a second contact in the second opening.

In eighteenth examples, for any of the seventeenth example, where the gate dielectric is formed on a top surface of each of the plurality of channel layers, and where the gate electrode is formed directly adjacent the gate dielectric.

In nineteenth examples, for any of the seventeenth through eighteenth examples, the gate dielectric is formed on a bottom surface of each of the plurality of channel layers, and where the gate electrode is formed on the gate dielectric below the bottom surface of each of the plurality of channel layers, and where the gate electrode extends from below a bottom surface of a lowermost channel layer in the plurality of channel layers to a top surface of a topmost channel layer in the plurality of channel layers.

In twentieth example, for any of the seventeenth through nineteenth examples, the III-N material is removed from the block in the first opening and from the block in the second opening prior to forming the first contact and the second contact.

What is claimed is:

1. A transistor structure comprising:
   a first channel layer vertically over a second channel layer, wherein the first and the second channel layers comprise a monocrystalline transition metal dichalcogenide (TMD);
   a source material coupled to a first end of the first and second channel layers;
   a drain material coupled to a second end of the first and second channel layers;
   a gate electrode laterally between the source material and the drain material, and vertically between the first channel layer and the second channel layer; and
   a gate dielectric between the gate electrode and each of the first channel layer and the second channel layer.

2. The transistor structure of claim 1, wherein the monocrystalline TMD of the first channel layer has a first crystal orientation, and the monocrystalline TMD of the second channel layer has the first crystal orientation.

3. The transistor structure of claim 1, wherein the each of the first channel layer and the second channel layer comprise a plurality of stacked 2-dimensional TMD layers.

4. The transistor structure of claim 1, wherein the monocrystalline TMD comprises at least one of molybdenum, tungsten or chromium, and at least one of sulfur, selenium or tellurium.

5. The transistor structure of claim 1, wherein the first channel layer and the second channel layer each have a thickness between 1 and 4 monolayers.

6. The transistor structure of claim 1, wherein each of the first and second channel layers have a first thickness along a first direction orthogonal to a longitudinal length, wherein each of the first and second channel layers have a second thickness along a second direction orthogonal to the first direction and to the longitudinal length, wherein the first thickness is between 5 nm and 60 nm, and wherein the second thickness is between 1 and 4 monolayers.

7. The transistor structure of claim 1, wherein the gate electrode is directly adjacent to a first portion of the gate dielectric on a top surface of the first channel layer and directly adjacent a second portion of the gate dielectric on a bottom surface of the second channel layer.

8. The transistor structure of claim 1, wherein the source material and the drain material are epitaxial to the monocrystalline TMD.

9. A transistor structure comprising:
a first nanowire above a second nanowire, wherein the first and the second nanowires comprise a crystal of a group III-Nitride (III-N) material;
a first channel layer comprising a monocrystalline transition metal dichalcogenide (TMD) directly adjacent the first nanowire;
a second channel layer comprising the monocrystalline TMD directly adjacent the second nanowire;
a source material coupled to a first end of the first and second channel layers;
a drain material coupled to a second end of the first and second channel layers;
a gate electrode between the source material and the drain material and between the first nanowire and the second nanowire; and
a gate dielectric between the gate electrode and each of the first channel layer and the second channel layer.

10. The transistor structure of claim 9, wherein the monocrystalline TMD of the first channel layer has a first crystal orientation, and the monocrystalline TMD of the second channel layer has the first crystal orientation, and wherein the monocrystalline TMD of the first channel layer and the monocrystalline TMD of the second channel layer are lattice matched to the crystal of the group III-N material.

11. The transistor structure of claim 9, wherein the monocrystalline TMD comprises at least one of molybdenum, tungsten or chromium, and at least one of sulfur, selenium or tellurium, and wherein the group III-N material comprises nitrogen and at least one of Al or In.

12. The transistor structure of claim 9, wherein each of the first nanowire and the second nanowire have a first thickness along a first direction orthogonal to a longitudinal length, wherein each of the first nanowire and the second nanowire have a second thickness along a second direction orthogonal to the first direction and to the longitudinal length, wherein the first thickness is between 5 nm and 60 nm, and wherein the second thickness is between 4 and 8 nm.

13. The transistor structure of claim 9, wherein the first channel layer is on a top surface and on a bottom surface of the first nanowire and the second channel layer is on a top surface and on a bottom surface of the second nanowire.

14. The transistor structure of claim 13, wherein the gate electrode is above the top surface of the first nanowire and below the bottom surface of the second nanowire and the gate dielectric is between the gate electrode and the first channel layer above the top surface of the first nanowire and between the gate electrode and the second channel layer below the bottom surface of the second nanowire.

15. The transistor structure of claim 13, wherein each of the first channel layer and the second channel layer each have a thickness between 1 and 4 monolayers.

16. The transistor structure of claim 13, wherein the first channel layer is on a sidewall surface of the first nanowire and the second channel layer is on a sidewall surface of the second nanowire.

17. A transistor structure comprising:
a first channel layer over a second channel layer, wherein the first and the second channel layers comprise a monocrystalline transition metal dichalcogenide (TMD);
a source material coupled to a first end of the first and second channel layers;
a drain material coupled to a second end of the first and second channel layers, wherein the source material and the drain material are epitaxial to the monocrystalline TMD;
a gate electrode between the source material and the drain material, and between the first channel layer and the second channel layer; and
a gate dielectric between the gate electrode and each of the first channel layer and the second channel layer.

18. The transistor structure of claim 17, wherein the monocrystalline TMD of the first channel layer has a first crystal orientation, and the monocrystalline TMD of the second channel layer has the first crystal orientation.

19. The transistor structure of claim 17, wherein the each of the first channel layer and the second channel layer comprise a plurality of stacked 2-dimensional TMD layers.

20. The transistor structure of claim 17, wherein the monocrystalline TMD comprises at least one of molybdenum, tungsten or chromium, and at least one of sulfur, selenium or tellurium.

* * * * *